US012444680B2

(12) United States Patent
Khaderbad et al.

(10) Patent No.: US 12,444,680 B2
(45) Date of Patent: Oct. 14, 2025

(54) INTERCONNECT STRUCTURES WITH CONDUCTIVE CARBON LAYERS

(71) Applicant: Taiwan Semiconductor Manufacturing Company, Ltd., Hsinchu (TW)

(72) Inventors: Mrunal Abhijith Khaderbad, Hsinchu (TW); Wei-Yen Woon, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 570 days.

(21) Appl. No.: 17/738,956

(22) Filed: May 6, 2022

(65) Prior Publication Data

US 2023/0010280 A1    Jan. 12, 2023

Related U.S. Application Data

(60) Provisional application No. 63/219,945, filed on Jul. 9, 2021.

(51) Int. Cl.
| | | |
|---|---|---|
| *H01L 23/528* | (2006.01) | |
| *H01L 23/522* | (2006.01) | |
| *H10D 30/67* | (2025.01) | |
| *H10D 62/80* | (2025.01) | |
| *H10D 84/01* | (2025.01) | |

(Continued)

(52) U.S. Cl.
CPC ...... *H01L 23/5283* (2013.01); *H01L 23/5226* (2013.01); *H10D 30/6713* (2025.01); *H10D 30/6735* (2025.01); *H10D 30/6757* (2025.01); *H10D 62/882* (2025.01); *H10D 84/0128* (2025.01); *H10D 84/013* (2025.01); *H10D 84/0149* (2025.01); *H10D 84/0158* (2025.01);

(Continued)

(58) Field of Classification Search
CPC ............. H01L 23/5283; H01L 23/5226; H01L 21/76838; H10D 30/6713; H10D 30/6735; H10D 30/6757; H10D 62/882; H10D 84/0128; H10D 84/013; H10D 84/0149; H10D 84/0158; H10D 84/038; H10D 84/834
USPC ....................................................... 257/734
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |

(Continued)

FOREIGN PATENT DOCUMENTS

| | | | | |
|---|---|---|---|---|
| CN | 107275279 A | * | 10/2017 | ....... H01L 21/76829 |
| CN | 107331646 A | * | 11/2017 | |
| TW | 201406647 A | * | 2/2014 | |

*Primary Examiner* — Norman D Richards
*Assistant Examiner* — Laura M Dykes
(74) *Attorney, Agent, or Firm* — Sterne, Kessler, Goldstein & Fox P.L.L.C.

(57) ABSTRACT

An integrated circuit (IC) with a semiconductor device and an interconnect structure with carbon layers and methods of fabricating the same are disclosed. The method includes forming a fin structure on a substrate, forming a source/drain region on the fin structure, forming a contact structure on the S/D region, forming an oxide layer on the contact structure, forming a conductive carbon line within a first insulating carbon layer on the oxide layer, forming a second insulating carbon layer on the first insulating carbon layer, and forming a via within the second insulating carbon layer.

20 Claims, 27 Drawing Sheets

(51) Int. Cl.
  *H10D 84/03* (2025.01)
  *H10D 84/83* (2025.01)
(52) U.S. Cl.
  CPC ......... *H10D 84/038* (2025.01); *H10D 84/834* (2025.01)

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2014/0167268 A1* | 6/2014 | Bao .................. H01L 23/53276 257/761 |
| 2017/0084484 A1* | 3/2017 | Reber ............... H01L 23/53276 |
| 2018/0005952 A1* | 1/2018 | Zhou ................. H01L 21/76849 |
| 2020/0098685 A1* | 3/2020 | Lee .................... H01L 23/5226 |

* cited by examiner

INTERCONNECT STRUCTURES WITH CONDUCTIVE CARBON LAYERS

CROSS-REFERENCE TO RELATED APPLICATIONS

This application claims the benefit of U.S. Provisional Patent Application No. 63/219,945, titled "Interconnect Structures with Graphene Layers," filed Jul. 9, 2021, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs) and interconnect structures disposed on the semiconductor devices. Such scaling down has increased the complexity of semiconductor manufacturing processes along with increased resistivity, increased resistance-capacitance (RC) delay, and decreased breakdown voltage of the interconnect structures.

BRIEF DESCRIPTION OF THE DRAWINGS

Aspects of this disclosure are best understood from the following detailed description when read with the accompanying figures.

Figure 1A:
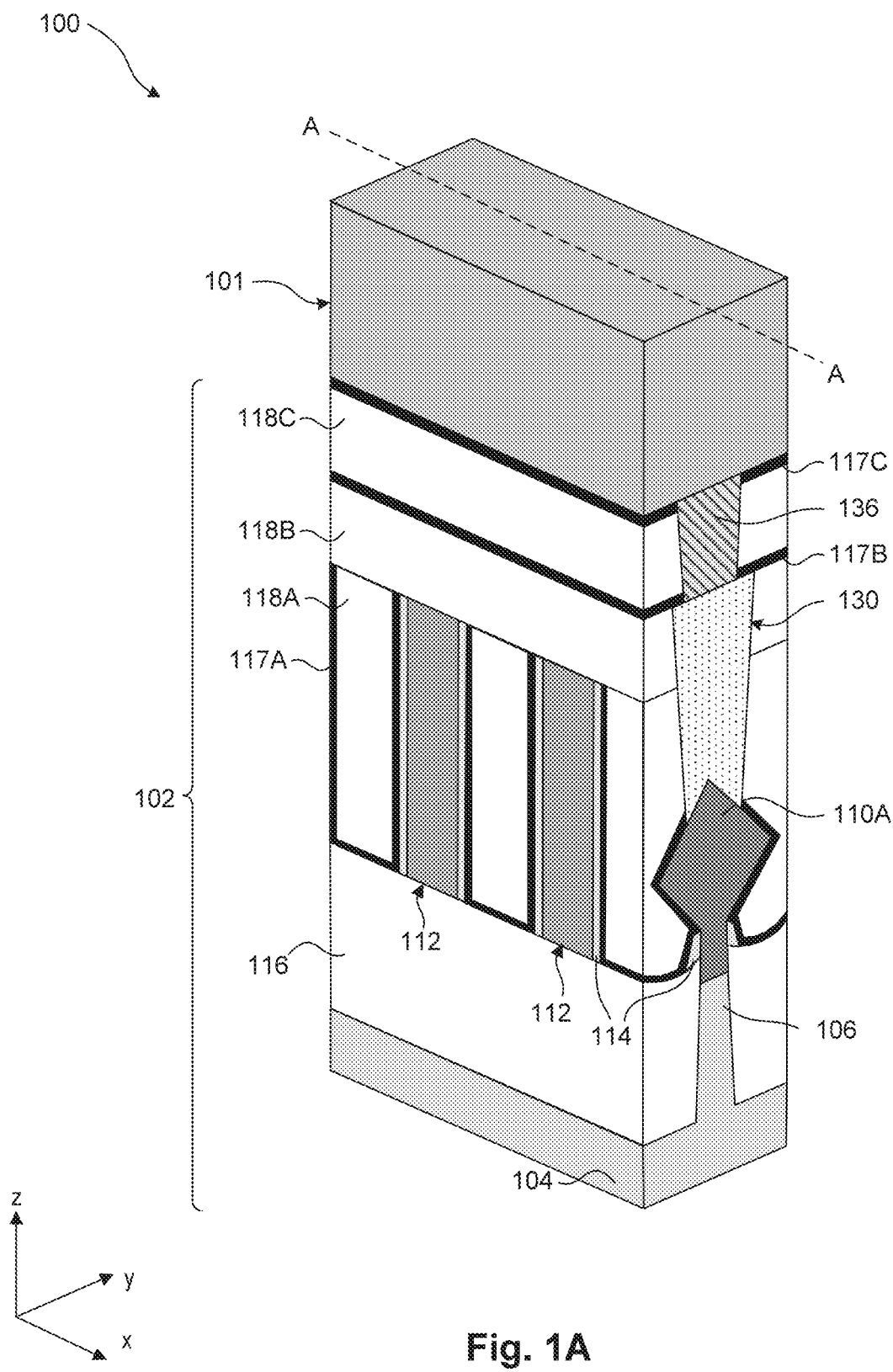
FIG. 1A illustrates an isometric view of an integrated circuit (IC) with a semiconductor device and an interconnect structure, in accordance with some embodiments.

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The increasing demand for small, portable multifunctional electronic devices has increased the demand for low power devices that can perform increasingly complex and sophisticated functions while providing ever-increasing storage capacity. As a result, there is a continuing trend in the semiconductor industry to manufacture low-cost, high-performance, and low-power integrated circuits (ICs) with semiconductor devices and interconnect structures. These goals have been achieved in large part by scaling down the dimensions of the semiconductor devices and/or interconnect structures, and thus increasing the device density of the ICs. However, continued scaling of metal-based interconnect lines and interlayer dielectric (ILD) layers of the interconnect structures introduces considerable challenges, such as increased resistivity, increased resistance-capacitance (RC) delay, and decreased breakdown voltage of the interconnect structures. The scaling down of the ILD layers of the interconnect structures is also limited by the oxide material density of the ILD layers that is required to electrically isolate interconnect lines from each other.

The present disclosure provides example ICs with semiconductor devices (e.g., gate-all-around (GAA) FETs or finFETs) and interconnect structures having carbon layers and provides methods of fabricating the same. In some embodiments, the interconnect structure can include conductive vias and interconnect lines having one or more conductive carbon layers (also referred to as "conductive carbon lines" or "conductive carbon-based interconnect lines") for routing electrical signals between the semiconductor devices of the IC and/or between power lines and the semiconductor devices of the IC. In some embodiments, the one or more conductive carbon layers can include one or more conductive graphene layers. With the use of conductive carbon-based interconnect lines instead of metal-based interconnect lines, the interconnect structure can be aggressively scaled down without increasing the resistivity and/or RC delay of the interconnect lines. The resistivity and RC delay of the conductive carbon-based (e.g., conductive graphene-based) interconnect lines can be significantly lower (e.g., about 2 to about 10 times lower) than that of metal-based interconnect lines with similar dimensions. In addition, unlike some metal-based interconnect lines, the conductive carbon-based interconnect lines do not need barrier layers (also referred to as "liners") surrounding the interconnect lines to prevent electro-migration of metal atoms into the semiconductor devices. As a result, the cost and complexity of fabricating the interconnect structure with the conductive carbon lines are significantly reduced compared to that of fabricating interconnect structures with metal lines.

In some embodiments, the conductive carbon lines can be formed within carbon-based ILD layers, which can include one or more fluorinated graphene layers or graphene oxide layers. The ILD layers with fluorinated graphene layers or graphene oxide layers have a density (e.g., about 2 gm/cc to about 5 gm/cc) higher than the density of ILD layers with silicon oxide and have a dielectric constant (e.g., less than about 2) lower than the dielectric constant of ILD layers with silicon oxide. As a result, with the use of carbon-based ILD layers, the interconnect structure can be aggressively scaled down without decreasing the breakdown voltage and/or increasing the RC delay of the interconnect structure. The breakdown voltage of the carbon-based ILD layers can be significantly higher than that of silicon oxide-based ILD layers with similar dimensions.

Figure 1B:
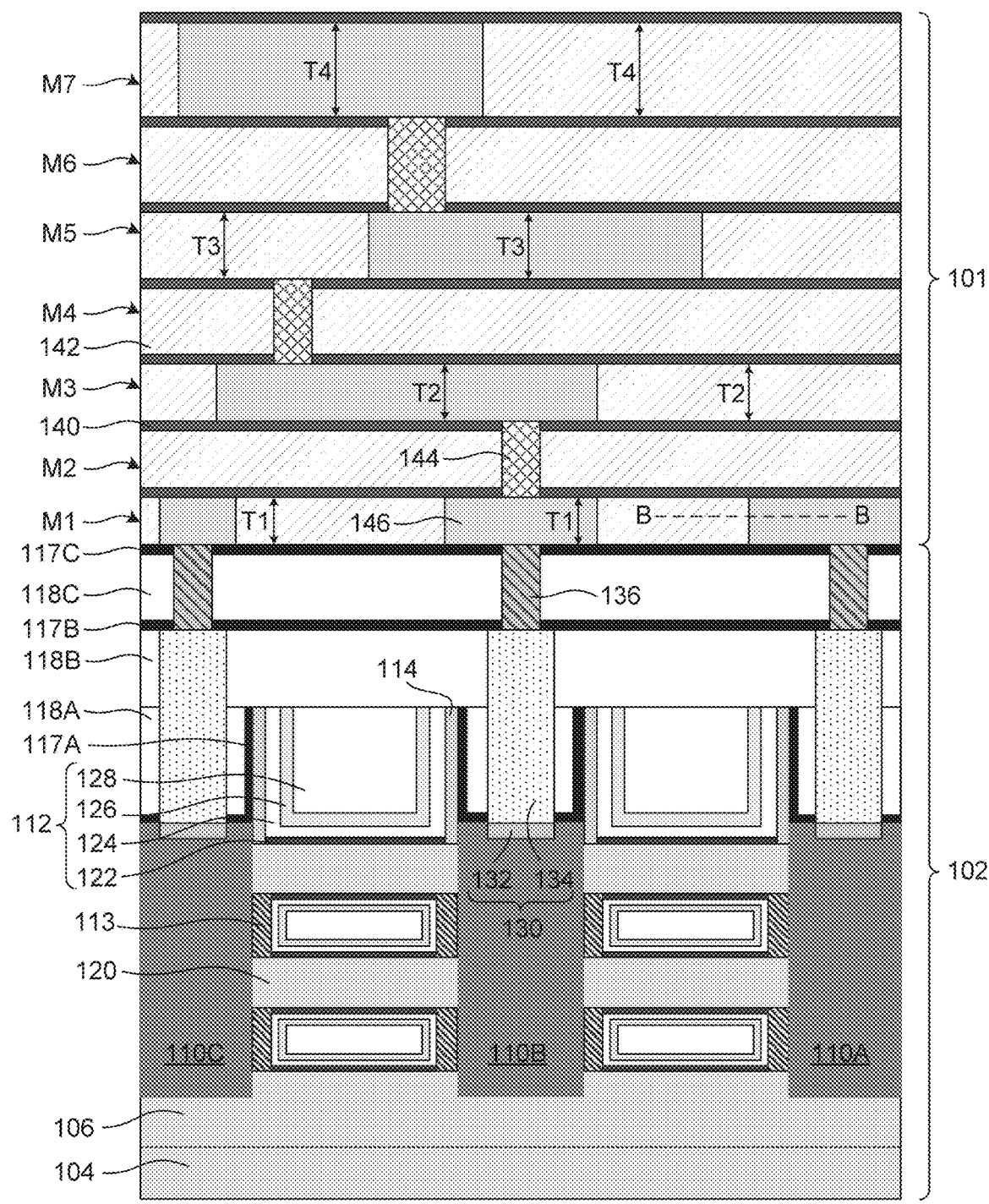
FIGS. 1B and 1D-1E illustrate cross-sectional views of an integrated circuit (IC) with a semiconductor device and an interconnect structure, in accordance with some embodiments.

FIG. 1A illustrates an isometric view of an IC 100 with an interconnect structure 101 disposed on a FET 102, according to some embodiments. The elements of interconnect structure 101 are not shown in FIG. 1A for simplicity. FIGS. 1B, 1D, and 1E illustrate different cross-sectional views of IC 100 along line A-A with additional structures that are not shown in FIG. 1A for simplicity. Interconnect structure 101 can have different cross-sectional views, as illustrated in FIGS. 1B and 1D, according to some embodiments. FET 102 can have different cross-sectional views, as illustrated in FIGS. 1B and 1E, according to some embodiments. In some embodiments, FET 102 can represent n-type FET 102 (NFET 102) or p-type FET 102 (PFET 102) and the discussion of FET 102 applies to both NFET 102 and PFET 102, unless mentioned otherwise. The discussion of elements in FIGS. 1A-1E with the same annotations applies to each other, unless mentioned otherwise.

Referring to FIG. 1A, FET 102 can include an array of gate structures 112 disposed on a fin structure 106 and an array of S/D regions 110A-110C (S/D region 110A visible in FIG. 1A; 110A-110C visible in FIGS. 1B, 1D, and 1E) disposed on portions of fin structure 106 that are not covered by gate structures 112. FET 102 can further include gate spacers 114, shallow trench isolation (STI) regions 116, etch stop layers (ESLs) 117A-117C, and ILD layers 118A-118C. In some embodiments, gate spacers 114, STI regions 116, ESLs 117A-117C, and ILD layers 118A-118C can include an insulating material, such as silicon oxide, silicon nitride (SiN), silicon carbon nitride (SiCN), silicon oxycarbon nitride (SiOCN), and silicon germanium oxide.

FET 102 can be formed on a substrate 104. There may be other FETs and/or structures (e.g., isolation structures) formed on substrate 104. Substrate 104 can be a semiconductor material, such as silicon, germanium (Ge), silicon germanium (SiGe), a silicon-on-insulator (SOI) structure, other suitable semiconductor materials, and a combination thereof. Further, substrate 104 can be doped with p-type dopants (e.g., boron, indium, aluminum, or gallium) or n-type dopants (e.g., phosphorus or arsenic). In some embodiments, fin structure 106 can include a material similar to substrate 104 and extend along an X-axis.

Referring to FIG. 1B, FET 102 can be a GAA FET 102 and can include (i) S/D regions 110A-110C, (ii) contact structures 130 disposed on S/D regions 110A-110C, (iii) via structures 136 disposed on contact structures 130, (iv) nanostructured channel regions 120 disposed on fin structure 106, and (v) gate structures 112 surrounding nanostructured channel regions 120. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm are within the scope of the disclosure. In some embodiments, FET 102 can be a finFET 102, as shown in FIG. 1E.

In some embodiments, nanostructured channel regions 120 can include semiconductor materials similar to or different from substrate 104. In some embodiments, nanostructured channel regions 120 can include Si, SiAs, silicon phosphide (SiP), SiC, SiCP, SiGe, silicon germanium boron (SiGeB), germanium boron (GeB), silicon germanium stannum boron (SiGeSnB), a III-V semiconductor compound, or other suitable semiconductor materials. Though rectangular cross-sections of nanostructured channel regions 120 are shown, nanostructured channel regions 120 can have cross-sections of other geometric shapes (e.g., circular, elliptical, triangular, or polygonal). Gate portions of gate structures 112 surrounding nanostructured channel regions 120 can be electrically isolated from adjacent S/D regions 110A-110C by inner spacers 113. Inner spacers 113 can include an insulating material, such as $SiO_x$, SiN, SiCN, SiOCN, and other suitable insulating materials.

Each of gate structures 112 can include (i) an interfacial oxide (IO) layer 122, (ii) a high-k (HK) gate dielectric layer 124 disposed on IO layer 122, (iii) a work function metal (WFM) layer 126 disposed on HK gate dielectric layer 124, and (iv) a gate metal fill layer 128 disposed on WFM layer 126. As used herein, the term "high-k" refers to a high dielectric constant. In the field of semiconductor device structures and manufacturing processes, high-k refers to a dielectric constant that is greater than the dielectric constant of $SiO_2$ (e.g., greater than about 3.9). IO layers 122 can include silicon oxide ($SiO_2$), silicon germanium oxide ($SiGeO_x$), germanium oxide ($GeO_x$), or other suitable oxide materials. HK gate dielectric layers 124 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), and other suitable high-k dielectric materials. For NFET 102, WFM layer 126 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based conductive materials, or a combination thereof. For PFET 102, WFM layer 126 can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), other suitable substantially Al-free conductive materials, or a combination thereof. Gate metal fill layers 128 can include a conductive material, such as tungsten (W), Ti, silver (Ag), ruthenium (Ru), molybdenum (Mo), copper (Cu), cobalt (Co), Al, iridium (Ir), nickel (Ni), metal alloys, other suitable conductive materials, and a combination thereof.

For NFET 102, each of S/D regions 110A-110C can include an epitaxially-grown semiconductor material, such as Si, and n-type dopants, such as phosphorus and other suitable n-type dopants. For PFET 102, each of S/D regions 110A-110C can include an epitaxially-grown semiconductor material, such as Si and SiGe, and p-type dopants, such as boron and other suitable p-type dopants. In some embodiments, each of contact structures 130 can include (i) a silicide layer 132 disposed within each of S/D regions 110A-110C and, (ii) a contact plug 134 disposed on silicide layer 132. In some embodiments, silicide layers 132 can include a metal silicide. In some embodiments, contact plugs 134 can include conductive materials with low resistivity (e.g., resistivity of about 50 μΩ-cm, about 40 μΩ-cm, about 30 μΩ-cm, about 20 μΩ-cm, or about 10 μΩ-cm), such as cobalt (Co), tungsten (W), ruthenium (Ru), iridium (Ir), nickel (Ni), Osmium (Os), rhodium (Rh), aluminum (Al), molybdenum (Mo), other suitable conductive materials with low resistivity, and a combination thereof. In some embodiments, via structures 136 can be disposed on contact structures 130 and can include conductive materials, such as Ru, Co, Ni, Al, Mo, W, Ir, Os, Cu, and Pt. Contact structures 130 can electrically connect to overlying interconnect structure 101 through via structures 136.

Interconnect structure 101 can be disposed on via structures 136 and ESL 117C. In some embodiments, interconnect structure 101 can include interconnect layers M1-M7. Though seven interconnect layers M1-M7 are discussed with reference to FIGS. 1B, interconnect structure 101 can have any number of interconnect layers. Each of interconnect layers M1-M7 can include an ESL 140 and an ILD layer 142. ESLs 140 can include a dielectric material, such as aluminum oxide ($Al_xO_y$) nitrogen doped silicon carbide (SiCN), and oxygen doped silicon carbide (SiCO) with a dielectric constant ranging from about 4 to about 10.

In some embodiments, ILD layers 142 can include one or more layers of insulating carbon material with a low dielectric constant of less than about 2 (e.g., ranging from about 1 to about 1.9) and a density higher than about 2 gm/cc (e.g., ranging from about 2.1 gm/cc to about 5 gm/cc). In some embodiments, the one or more layers of insulting carbon material can include one or more fluorinated graphene layers with a dielectric constant ranging from about 1 to about 1.5 and a density ranging from about 2.1 gm/cc to about 4 gm/cc, or can include one or more graphene oxide layers. In some embodiments, each of the fluorinated graphene layers can include a two-dimensional carbon layer of $sp^3$ hybridized carbon atoms with each carbon atom bound to one fluorine atom. In some embodiments, ILD layers 142 with one or more fluorinated graphene layers can have a fluorine concentration of about $1\times10^{18}$ atoms/cm$^3$ to about $1\times10^{21}$ atoms/cm$^3$. ILD layers 142 with such low dielectric constant can significantly reduce the RC delay in interconnect structure 101 compared to interconnect structures with silicon oxide-based ILD layers of similar dimensions. In addition, ILD layers 142 with such high density can significantly increase the breakdown voltage in interconnect structure 101, and consequently improve reliability of interconnect structure 101 compared to interconnect structures with silicon oxide-based ILD layers of similar dimensions.

In some embodiments, each of interconnect layers M1, M3, M5, and M7 can further include one or more interconnect lines 146 (also referred to as "conductive carbon lines 146" or "conductive carbon-based interconnect lines 146") and/or each of interconnect layers M2, M4, and M6 can further include one or more conductive vias 144. The layout of interconnect lines 146 and conductive vias 144 is exemplary and not limiting and other layout variations of interconnect lines 146 and conductive vias 144 are within the scope of this disclosure. The number and arrangement of interconnect lines 146 and conductive vias 144 in each of interconnect layers M1-M7 can be different from the ones shown in FIG. 1B. The routings (also referred to as "electrical connections") between FET 102 and interconnect layers M1-M7 are exemplary and not limiting. There may be routings between FET 102 and interconnect layers M1-M7 that are not visible in the cross-sectional view of FIG. 1B.

Each of interconnect lines 146 can be disposed within ILD layer 142 and each of conductive vias 144 can be disposed within ILD layer 142 and a pair of ESLs 140 disposed on top and bottom surfaces of the corresponding ILD layer 142. Conductive vias 144 provide electrical connections between interconnect lines 146 of adjacent interconnect layers. In some embodiments, conductive vias 144 can include conductive materials, such as Cu, Ru, Co, Mo, carbon nanotubes, graphene layers, and any other suitable conductive material. In some embodiments, interconnect lines 146 can include one or more layers of electrically conductive carbon material. In some embodiments, the one or more layers of electrically conductive carbon material can include crystalline carbon material and does not include amorphous carbon material. In some embodiments, the one or more layers of electrically conductive carbon material can include one or more graphene layers with an electrical conductivity that is about 40% to about 70% greater than that of metals, such as Cu, Co, and Ru, and does not include amorphous carbon material. In some embodiments, each of the graphene layers can include a two-dimensional carbon layer of $sp^2$ hybridized carbon atoms.

With the use of highly conductive carbon-based interconnect lines 146 and low dielectric constant carbon-based ILD layers 142, interconnect structure 101 can be aggressively scaled down without increasing the resistivity and/or RC delay of interconnect lines 146. In some embodiments, thicknesses T1-T4 of interconnect lines 146 can be scaled down to about 0.3 nm to about 1 nm without compromising the electrical conductivity and reliability of interconnect structure 101. The resistivity and RC delay of interconnect lines 146 are significantly lower (e.g., about 2 to about 10 times lower) than that of metal-based interconnect lines with similar dimensions. In addition, unlike some metal-based interconnect lines, interconnect lines 146 do not need barrier layers surrounding interconnect lines 146 to prevent electromigration of metal atoms into FET 102. As a result, the cost and complexity of fabricating interconnect structure 101 with interconnect lines 146 are significantly reduced compared to that of fabricating interconnect structures with metal lines.

Figure 1C:
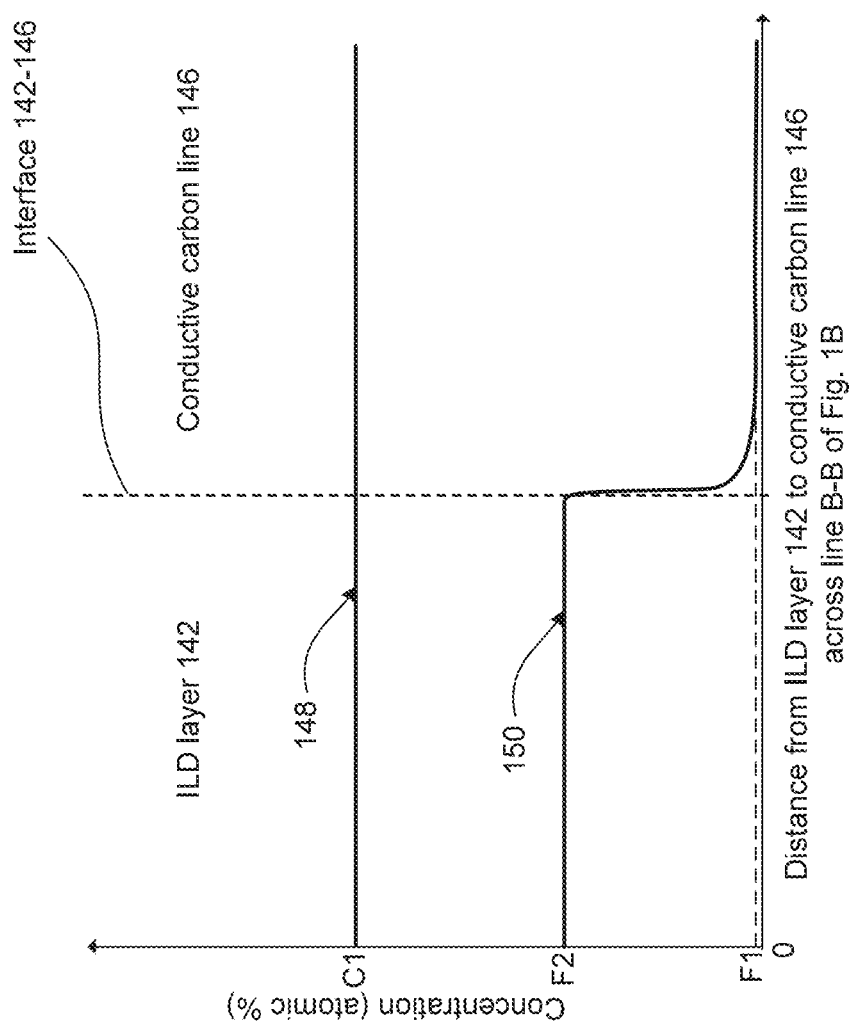
FIG. 1C illustrate characteristics of an interconnect structure, in accordance with some embodiments.
Figure 1D:
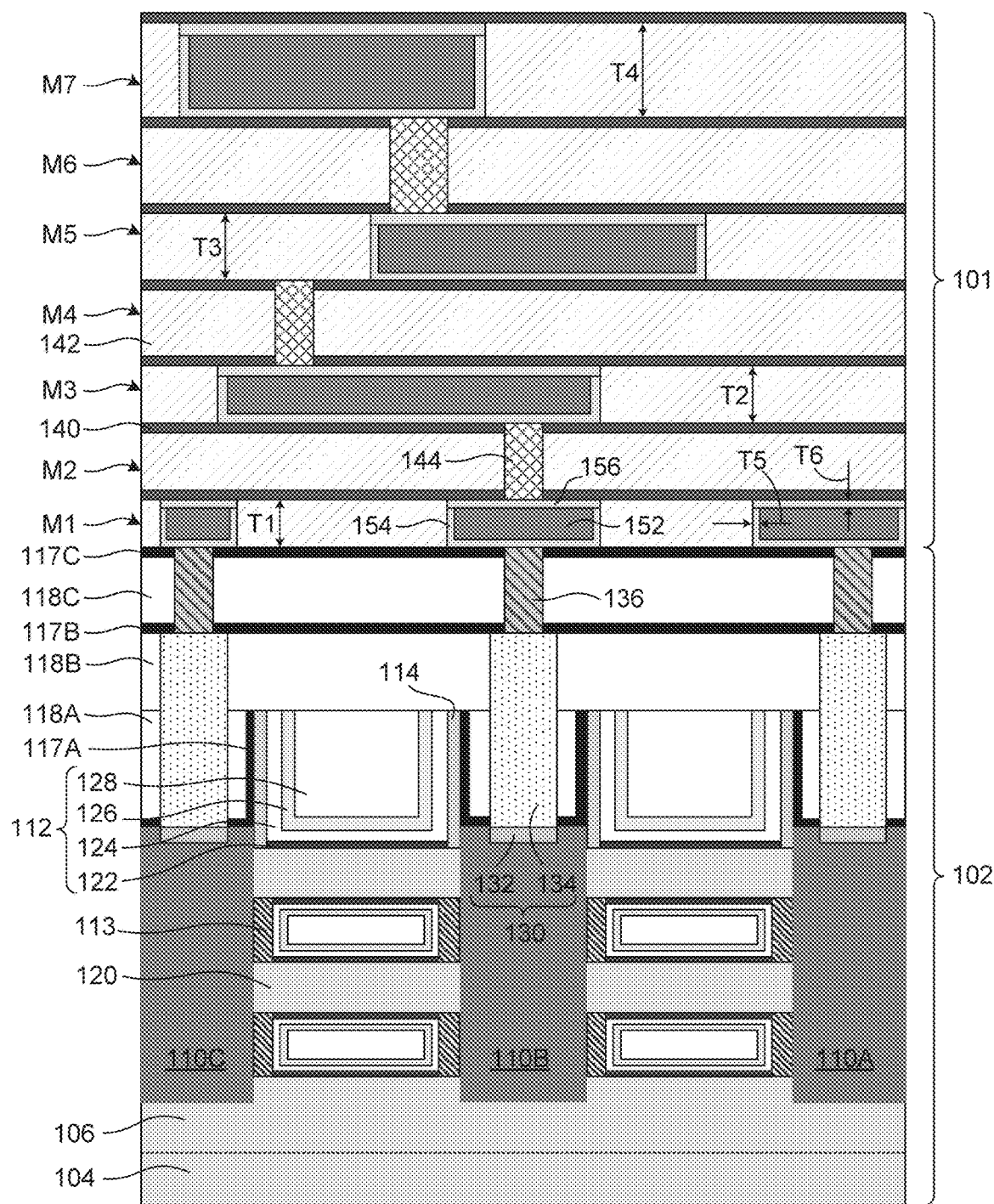
Figure 1E:
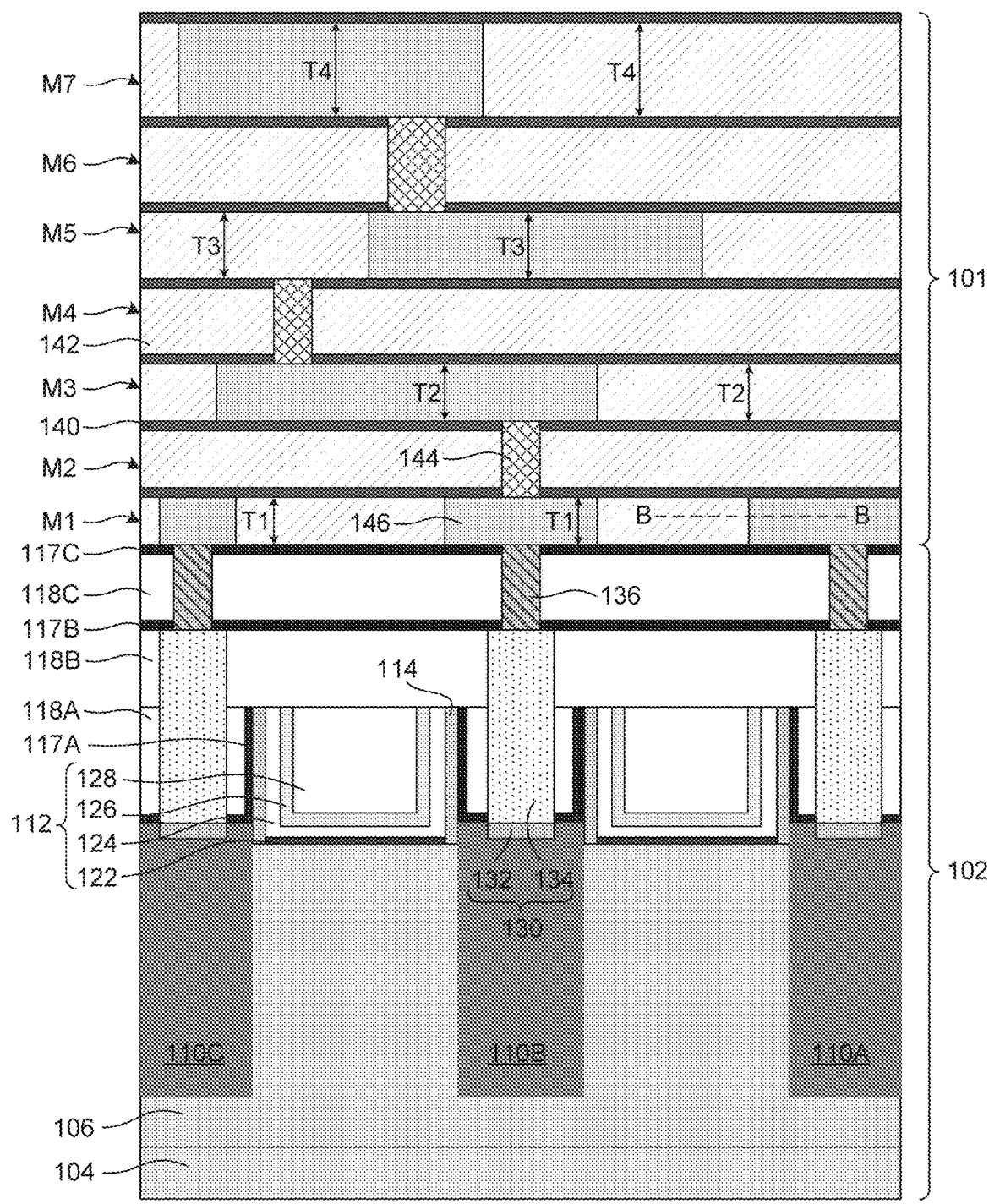

FIG. 1C illustrates carbon concentration profile 148 and fluorine concentration profile 150 across interconnect line 146 and ILD layer 142 of interconnect layer M1 along line B-B of FIG. 1B. Similar concentration profiles exist between the other interconnect lines 146 and ILD layers 142 of interconnect structure 101. In some embodiments, interconnect lines 146 and ILD layers 142 have substantially equal concentration C1 of carbon atoms, which is greater than concentrations F1-F2 of fluorine atoms, as illustrated in FIG. 1C. The concentration of fluorine atoms drops sharply from concentration F2 (e.g., about $1\times10^{18}$ atoms/cm$^3$ to about $1\times10^{21}$ atoms/cm$^3$) to concentration F1 (e.g., about zero) at interface 142-146 between interconnect lines 146 and ILD layers 142.

Referring to FIG. 1B, thicknesses T1-T4 of interconnect lines 146 can be substantially equal to or different from each other. In some embodiments, thicknesses T1-T4 can range from about 0.3 nm to about 100 nm. The minimum value of about 0.3 nm for thicknesses T1-T4 of interconnect lines 146 may be constrained by the atomic dimensions of carbon atoms. On the other hand, if thicknesses T1-T4 are greater than about 100 nm, the size and manufacturing cost of interconnect structure 101 increases.

Referring to FIG. 1D, in some embodiments, instead of interconnect lines 146, interconnect structure 101 can have metal lines 152 with (i) carbon capping layers 156 disposed on top surfaces of metal lines 152, and (ii) carbon liners 154 disposed on sidewalls and bottom surfaces of metal lines 152. In some embodiments, metal lines 152 can include conductive materials, such as Cu, Ru, Co, Mo, and any other suitable conductive material. In some embodiments, carbon liners 154 and carbon capping layers 156 can include one or more layers of electrically conductive carbon material. In some embodiments, the one or more layers of electrically conductive carbon material can include crystalline carbon material and does not include amorphous carbon material. In some embodiments, the one or more layers of electrically conductive carbon material can include one or more graphene layers. Carbon liners 154 provide denser barrier layers compared to metal-based liners of similar dimensions. As a result, carbon liners 154 are more effective in blocking electro-migration of metal atoms from metal lines 152 to FET 102 compared to metal-based liners of similar dimensions. In some embodiments, carbon liners 154 can have a thickness T5 ranging from about 0.3 nm to about 10 nm and carbon capping layers 156 can have a thickness T6 ranging from about 0.3 nm to about 20 nm. The minimum value of about 0.3 nm for thicknesses T5-T6 may be constrained by the atomic dimensions of carbon atoms. On the other hand, if thickness T5 is greater than about 10 nm and thickness T6 is greater than 20 nm, the size and manufacturing cost of interconnect structure 101 increases. In some embodiments, thicknesses T5-T6 are smaller than thicknesses T1-T4 and a ratio of T5:T6 can range from about 1:1 to about 1:3.

Figure 2A:
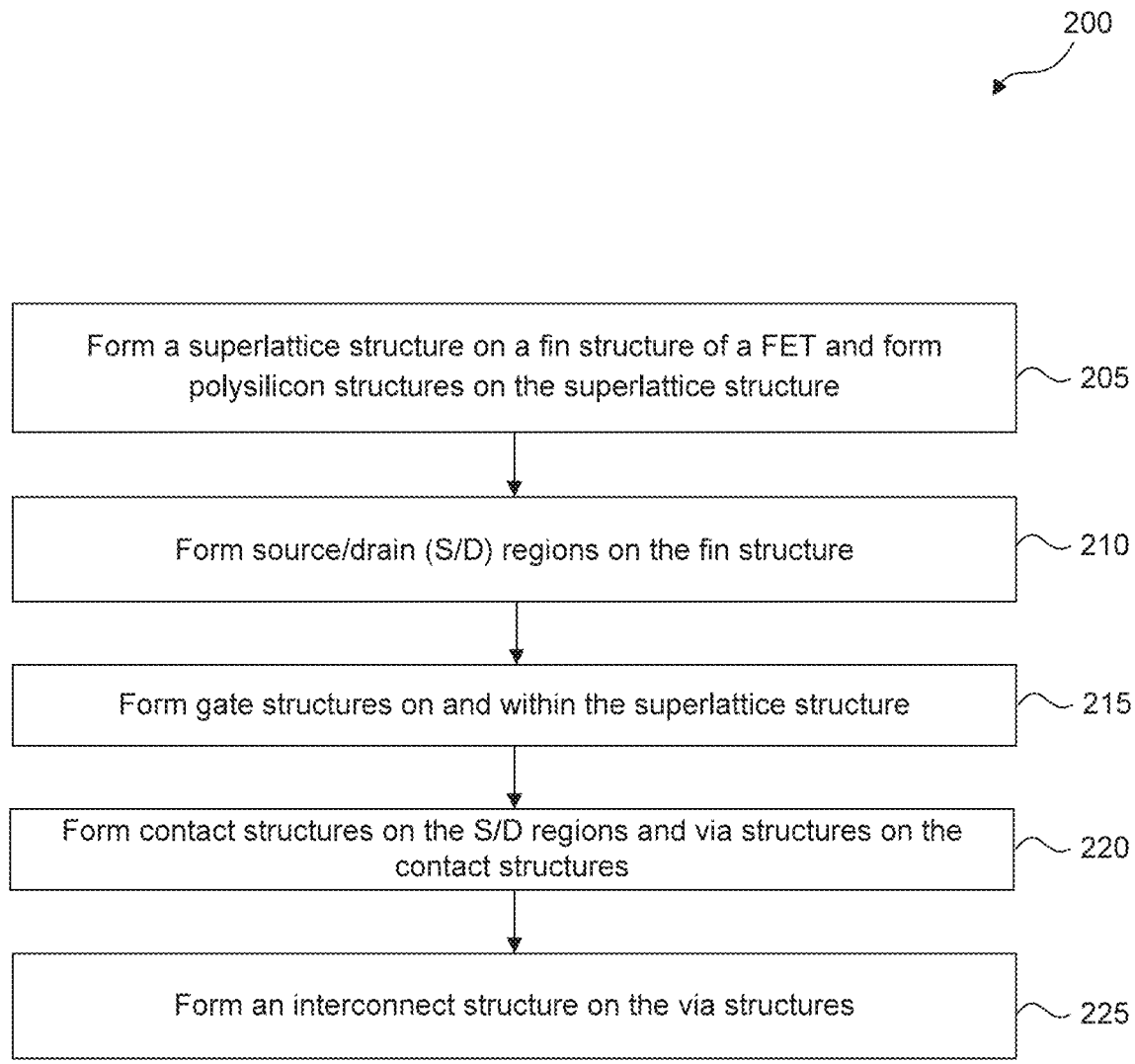
FIG. 2A is a flow diagram of a method for fabricating an integrated circuit (IC) with a semiconductor device and an interconnect structure, in accordance with some embodiments.
Figure 2B:
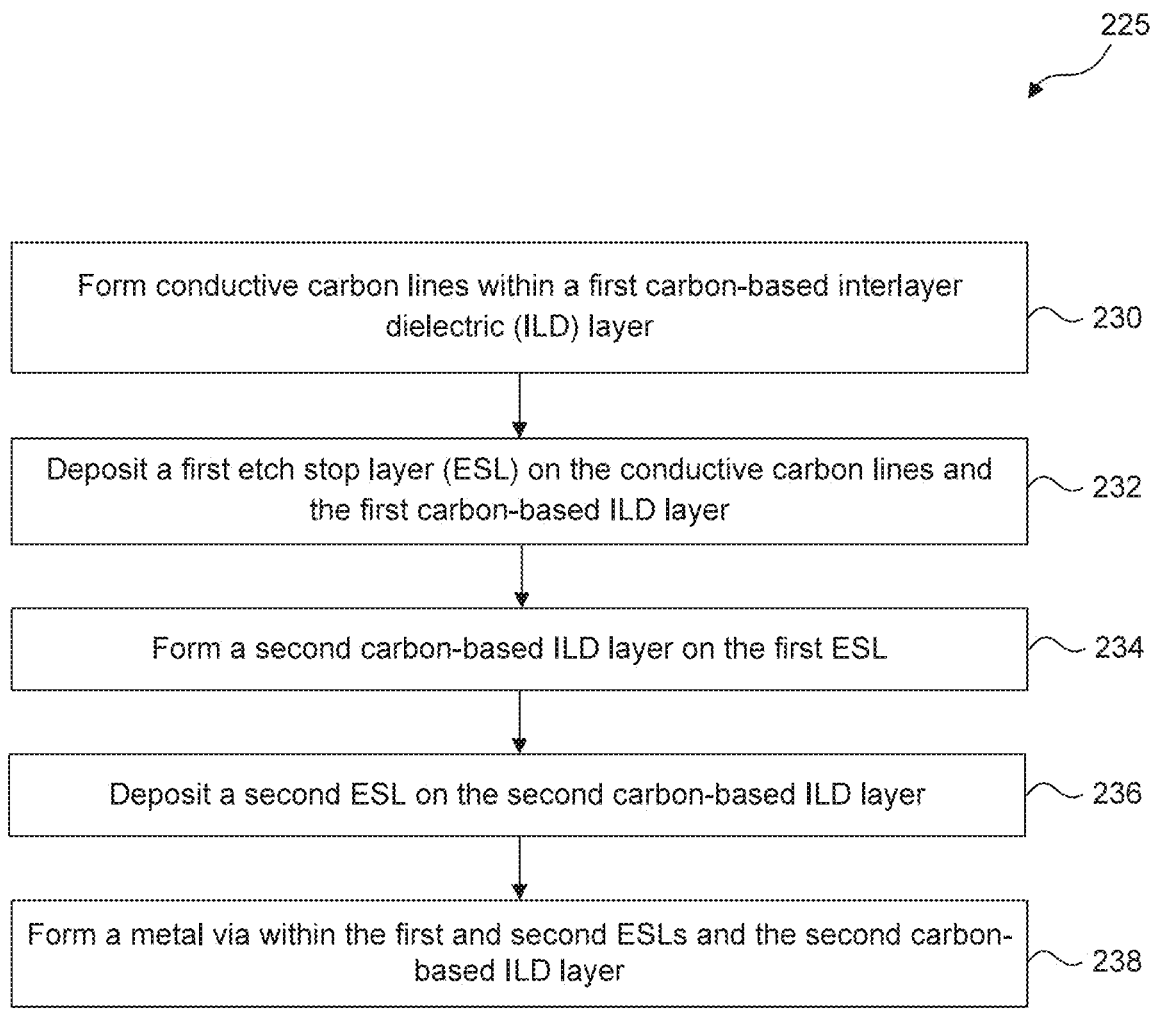
FIG. 2B-2C are flow diagrams of methods for fabricating an interconnect structure, in accordance with some embodiments.
Figure 2C:
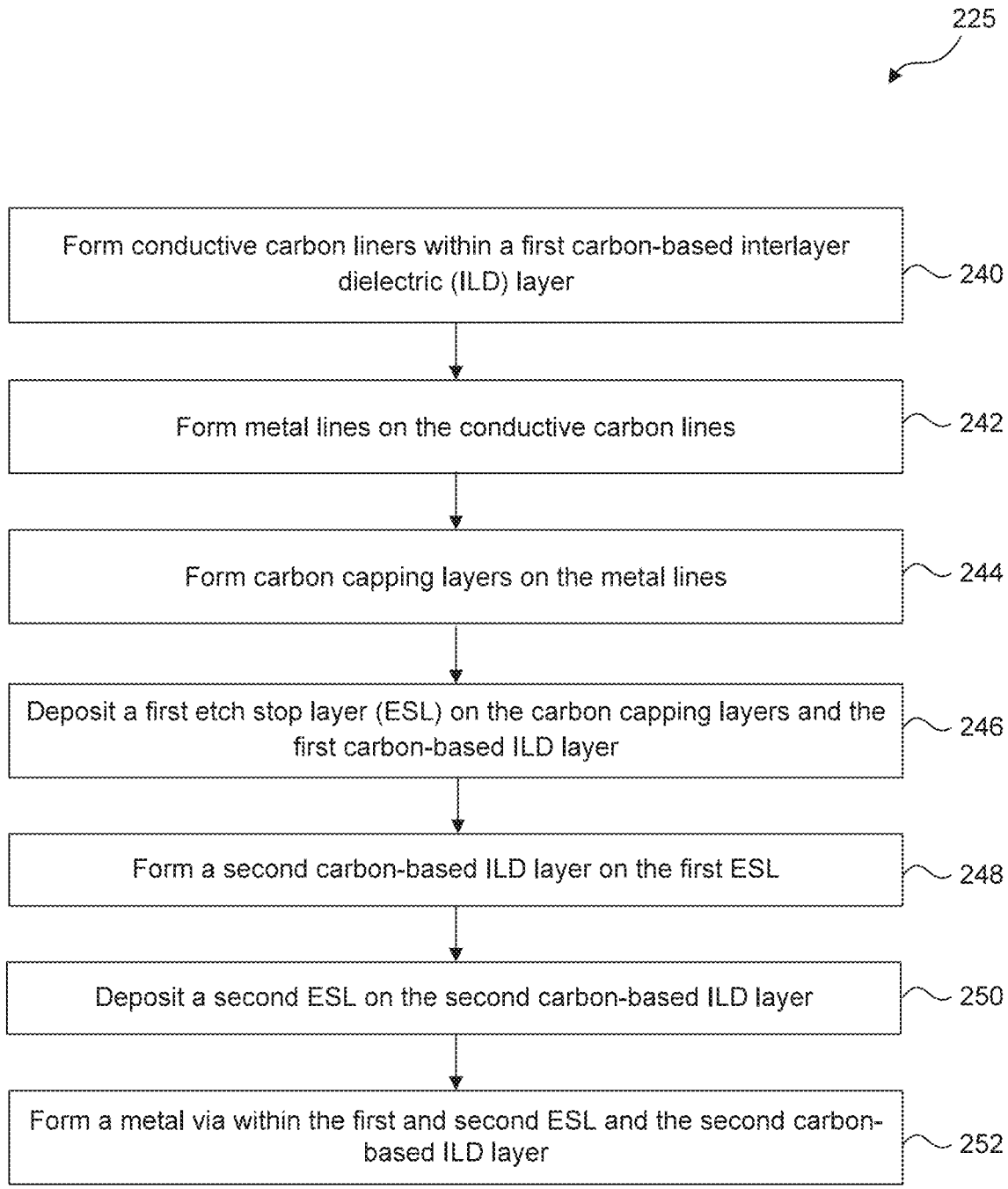

FIG. 2A is a flow diagram of an example method 200 for fabricating IC 100 with cross-sectional views shown in FIGS. 1B, 1D, and 1E, according to some embodiments. FIG. 2B is a flow diagram of operation 225 of example method 200 for fabricating interconnect structure 101 with a cross-sectional view shown in FIG. 1B, according to some embodiments. FIG. 2C is a flow diagram of operation 225 of example method 200 for fabricating interconnect structure 101 with a cross-sectional view shown in FIG. 1D, according to some embodiments. For illustrative purposes, the operations illustrated in FIGS. 2A-2C will be described with reference to FIGS. 3-23. FIGS. 3-23 are cross-sectional views of IC 100 along line A-A of FIG. 1A at various stages of fabrication, according to some embodiments. Operations can be performed in a different order or not performed depending on specific applications. It should be noted that method 200 may not produce a complete IC 100. Accordingly, it is understood that additional processes can be provided before, during, and after method 200, and that some other processes may only be briefly described herein. Elements in FIGS. 3-23 with the same annotations as elements in FIGS. 1A-1E are described above.

Figure 3:
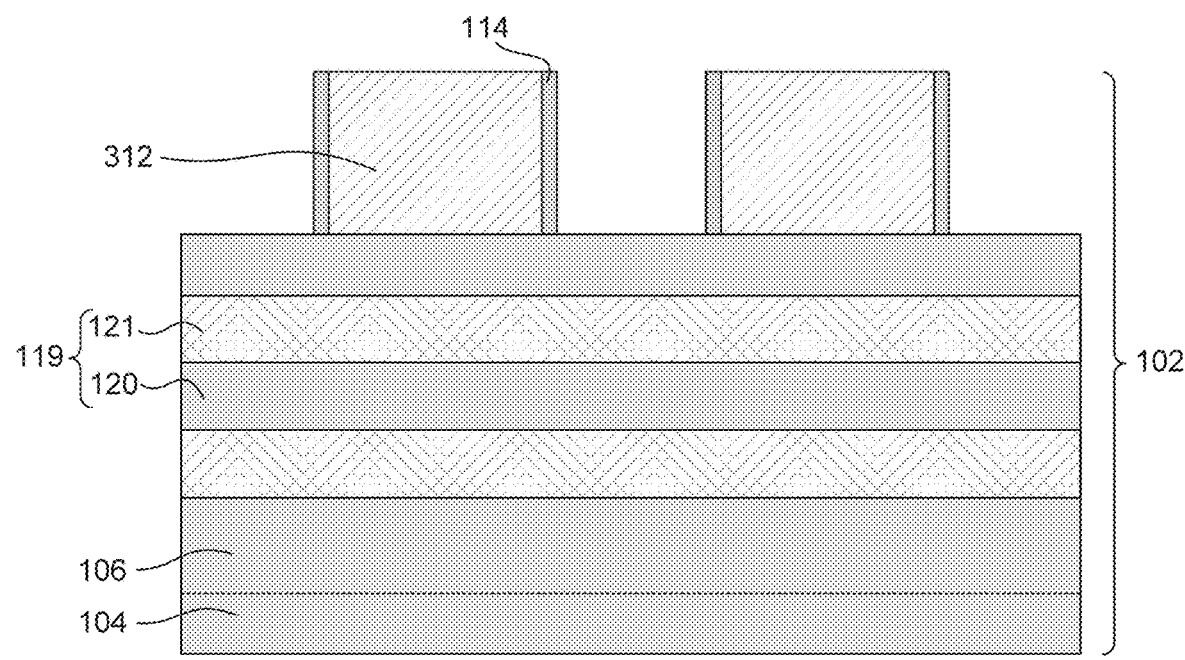
FIGS. 3-16 illustrate cross-sectional views of an integrated circuit (IC) with a semiconductor device and an interconnect structure at various stages of its fabrication process, in accordance with some embodiments.

In operation 205, a superlattice structure is formed on a fin structure of a FET, and polysilicon structures are formed on the superlattice structure. For example, as shown in FIG. 3, polysilicon structures 312 are formed on a superlattice structure 119, which is epitaxially formed on fin structure 106. Superlattice structure 119 can include nanostructured layers 120-121 arranged in an alternating configuration. In some embodiments, nanostructured layers 120-121 include materials different from each other. In some embodiments, nanostructured layers 121 can include SiGe and nanostructured layers 120 can include Si without any substantial amount of Ge (e.g., with no Ge). During subsequent processing, polysilicon structures 312 and nanostructured layers 121 can be replaced in a gate replacement process to form gate structures 112.

Figure 4:
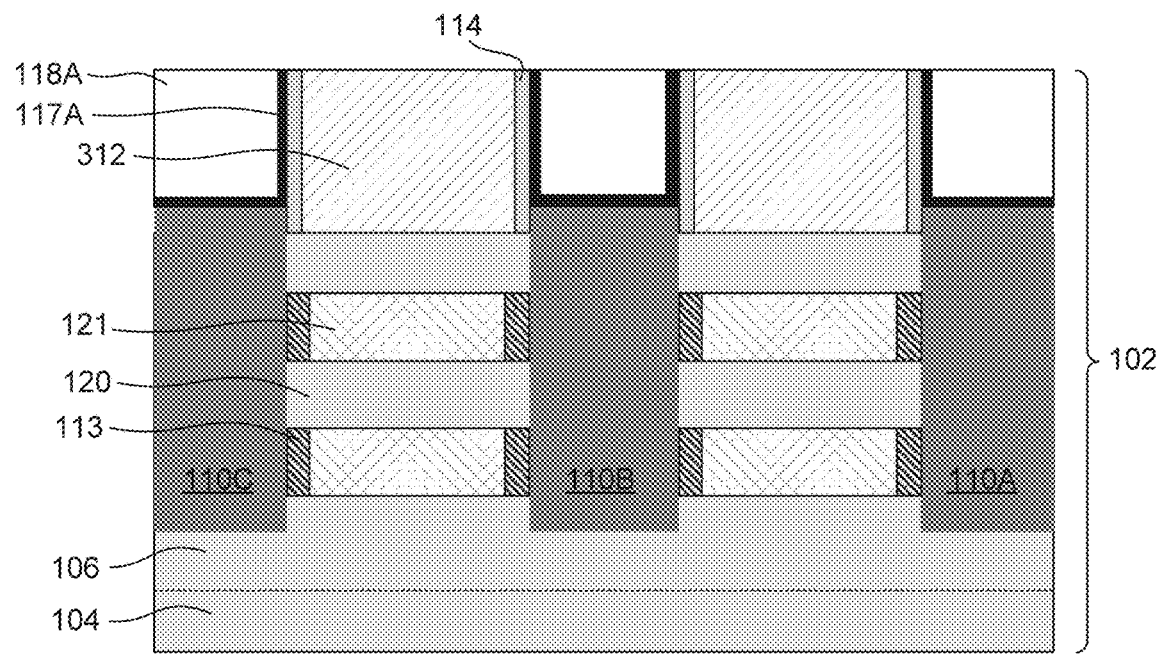

Referring to FIG. 2A, in operation 210, S/D regions are formed on the fin structure. For example, as shown in FIG. 4, S/D regions 110A-110C are formed on fin structure 106. The formation of S/D regions 110A-110C can include sequential operations of (i) forming S/D openings (not shown) through superlattice structure 119 on portions of fin structure 106 that are not underlying polysilicon structures 312, and (ii) epitaxially growing semiconductor materials within S/D openings, as shown in FIG. 4. In some embodiments, inner spacers 113 can be formed between operations (i) and (ii) of the formation process of epitaxial S/D regions 110A-110C, as shown in FIG. 4. Inner spacers 113 can be formed after the formation of S/D openings. After the formation of S/D regions 110A-110C, ESL 117A and ILD layer 118A can be formed on S/D regions 110A-110C to form the structure of FIG. 4.

Figure 5:
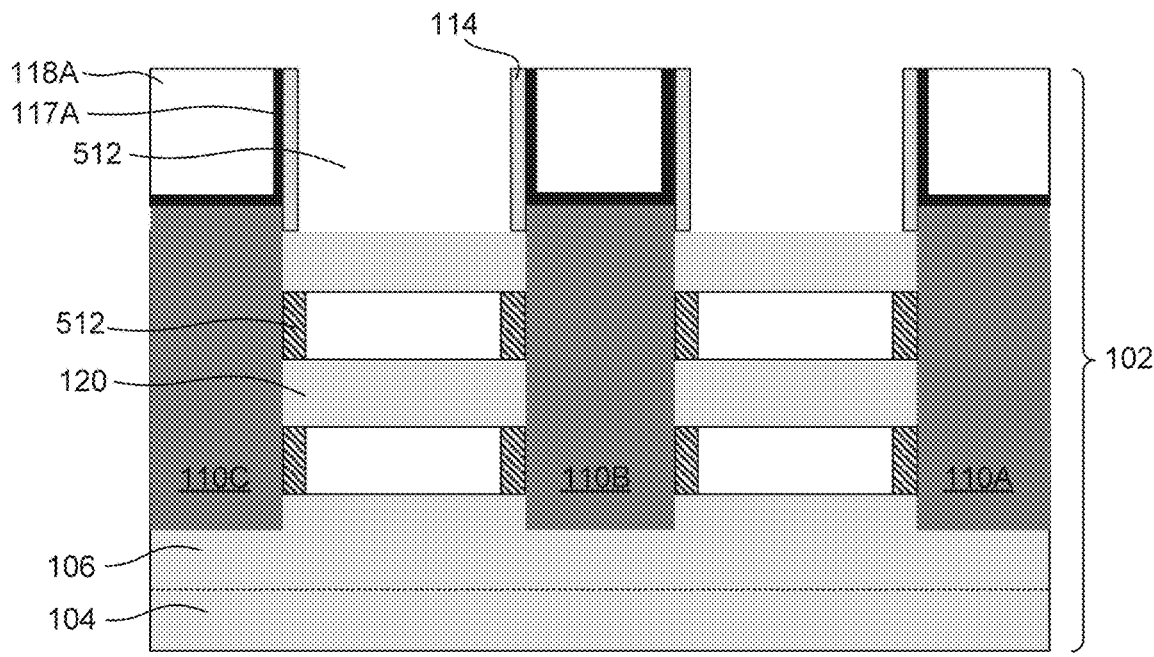
Figure 6:
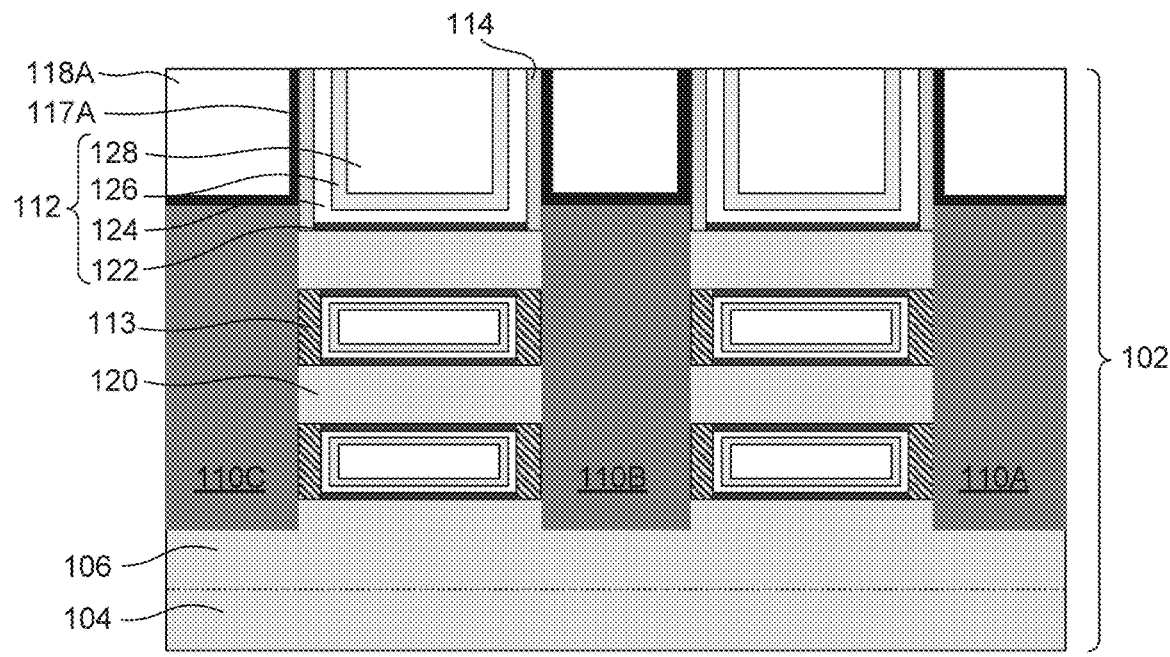
Figure 7:
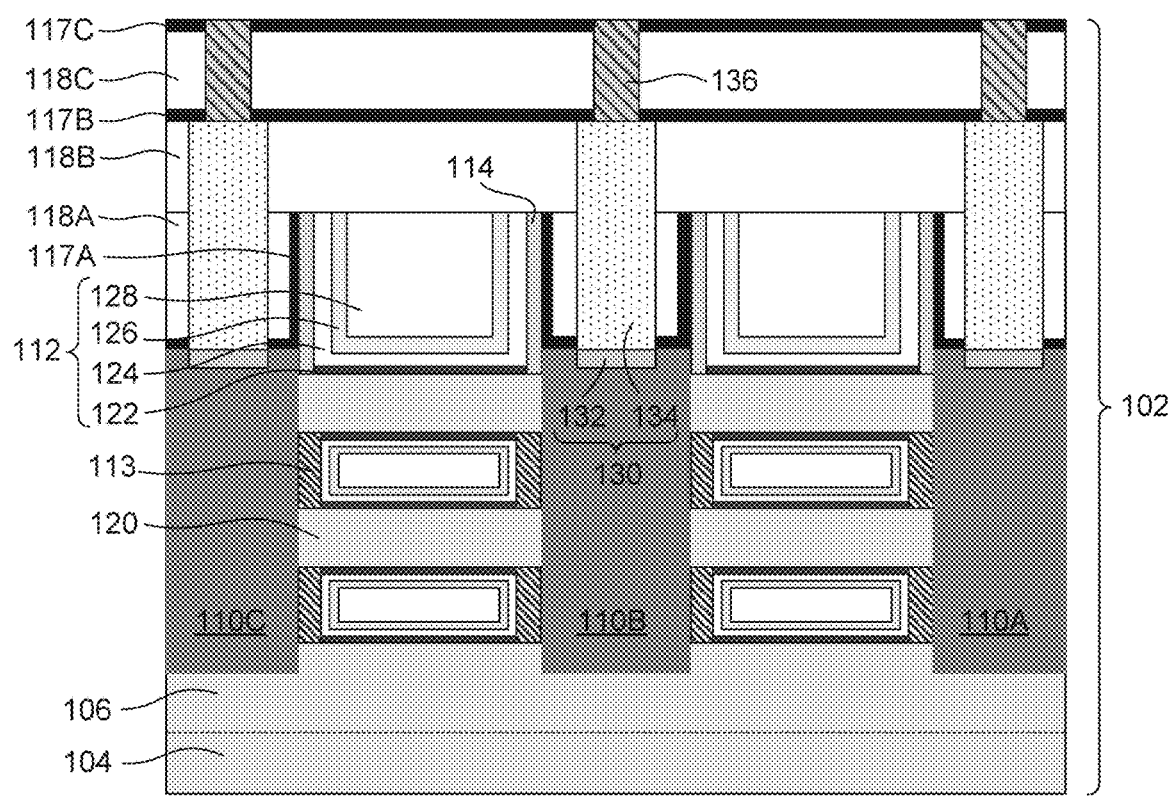

Referring to FIG. 2A, in operation 215, gate structures are formed are formed on and within the superlattice structure. For example, as described with reference to FIGS. 5-6, gate structures 112 are formed. The formation of gate structures 112 can include sequential operations of (i) forming gate openings 512, as shown in FIG. 5, (ii) forming IO layers 122 within gate openings 512, as shown in FIG. 6, (iii) depositing a high-k gate dielectric material on the structure of FIG. 5 after the formation of IO layers 122, (iv) depositing a WFM material on the high-k gate dielectric material (not shown), (v) depositing a gate metal fill material on the WFM material (not shown), and (vi) performing a chemical mechanical process (CMP) on the high-k gate dielectric material, the WFM material, and the gate metal fill material to form high-k gate dielectric layers 124 WFM layers 126, and gate metal fill layers 128, as shown in FIG. 6. The formation of gate openings 512 can include etching polysilicon structures 312 and nanostructured layers 121 from the structure of FIG. 4. After the formation of gate structures 112, ILD layer 118B can be formed, as shown in FIG. 7.

Referring to FIG. 2A, in operation 220, contact structures are formed on the S/D regions and via structures are formed on the contact structures. For example, as shown in FIG. 7, contact structures 130 are formed on S/D regions 110A-110C and via structures 136 are formed on contact structures 130. The formation of contact structures 130 can include sequential operations of (i) forming silicide layers 132 within S/D regions 110A-110C, as shown in FIG. 7, and (ii) forming contact plugs 134 on silicide layers 132 and within ESL 117A and ILD layers 118A-118B. After the formation of contact structures 130, ESLs 117B-117C and ILD layer 118C can be formed, as shown in FIG. 7. The formation of via structures 136 can include sequential operations of (i) forming via openings (not shown) within ESLs 117B-117C and ILD layer 118C, (ii) filling via openings with conductive material (not shown), and (iii) performing a CMP process on the conductive material to form the structure of FIG. 7.

Figure 23:
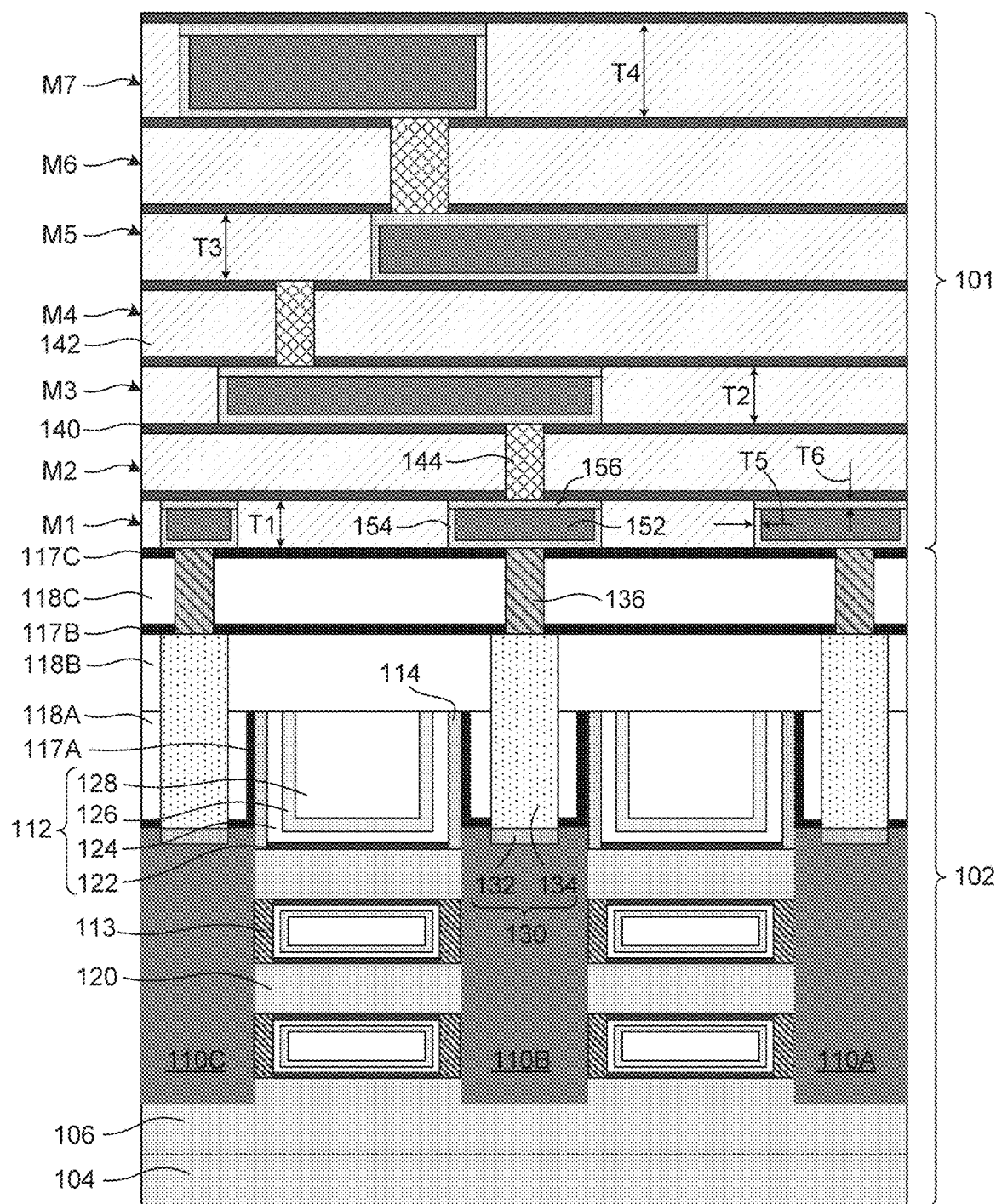

Referring to FIG. 2A, in operation 225, an interconnect structure is formed on the via structures. For example, as shown in FIG. 16, interconnect structure 101 (with a cross-sectional view shown in FIG. 1B) is formed on via structures 136, or as shown in FIG. 23, interconnect structure 101 (with a cross-sectional view shown in FIG. 1D) is formed on via structures 136.

Figure 16:
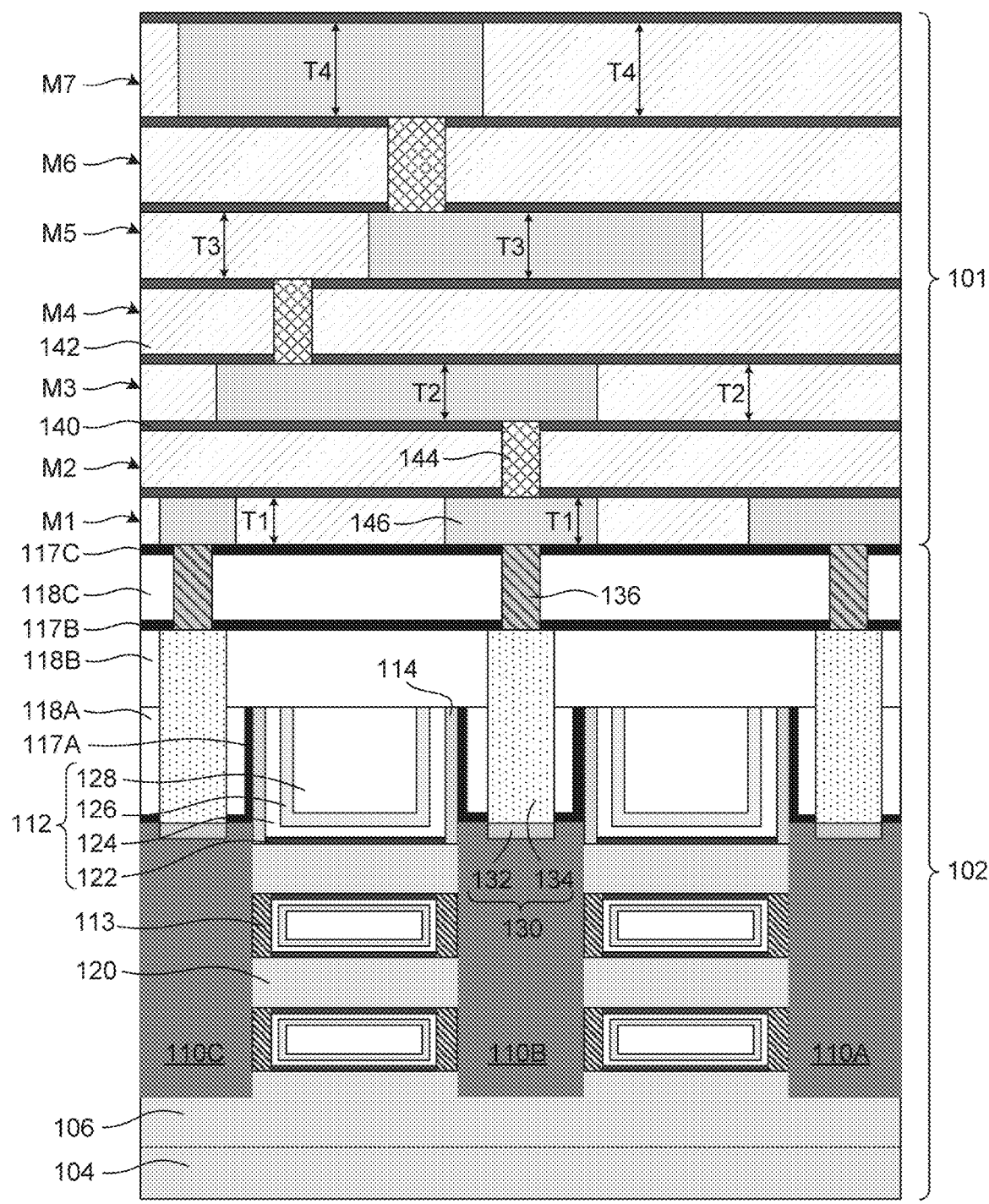

In some embodiments, operation 225 can include operations 230-238, as shown in FIG. 2B, to form interconnect structure 101 as shown in FIG. 16.

Figure 8:
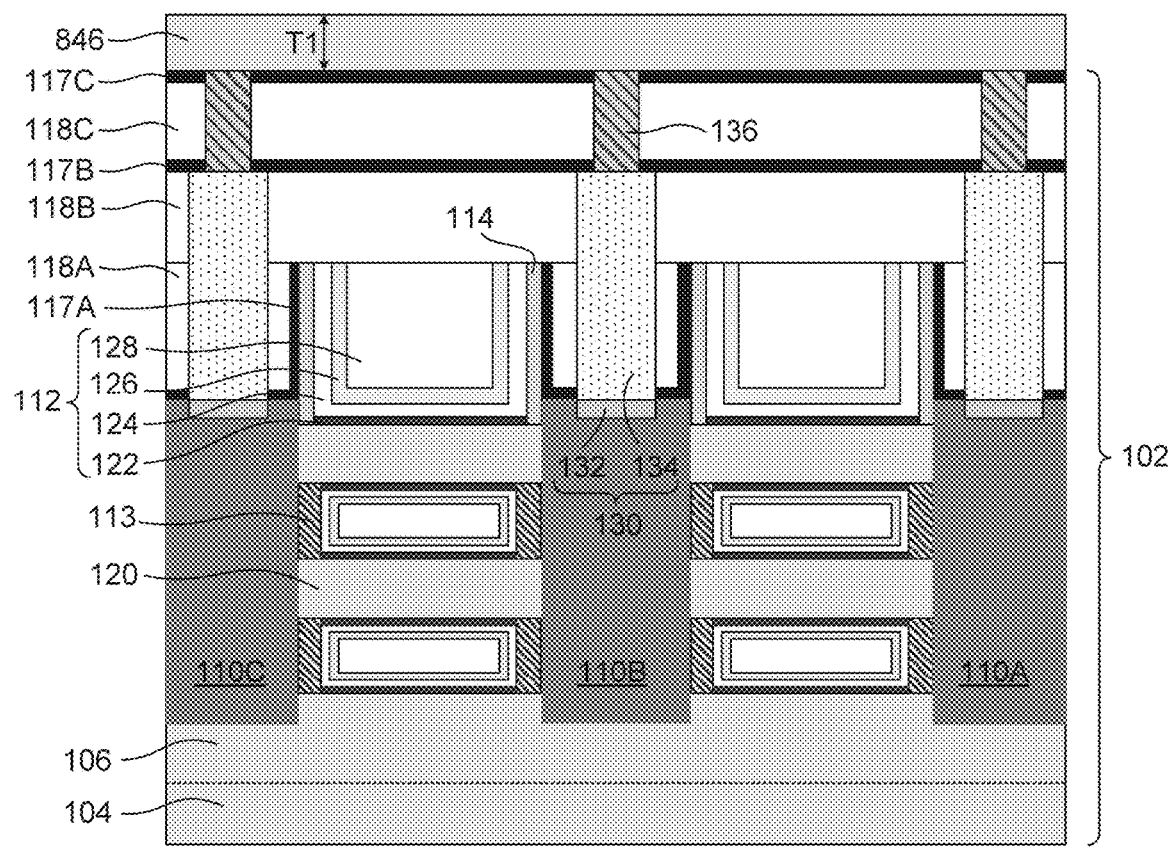

Referring to FIG. 2B, in operation 230, conductive carbon lines are formed within a first carbon-based ILD layer. For example, as described with reference to FIGS. 8-10, conductive carbon lines 146 are formed within first carbon-based ILD layer 142. The formation of conductive carbon lines 146 can include sequential operations of (i) forming a conductive carbon layer 846 on the structure of FIG. 7, as shown in FIG. 8, (ii) forming a patterned non-carbon-based masking layer 958 on conductive carbon layer 846, as shown in FIG. 9, (iii) performing a plasma process with fluorine ions and/or radicals 960 (also referred to as a "plasma fluorination process") on the structure of FIG. 9 to convert unmasked portions of conductive carbon layer 846 into fluorinated carbon layers of first carbon-based ILD layer 142 with a fluorine concentration of about $1 \times 10^{18}$ atoms/cm$^3$ to about $1 \times 10^{21}$ atoms/cm$^3$, as shown in FIG. 10, and (iv) removing patterned masking layer 958 from the structure of FIG. 10.

In some embodiments, conductive carbon layer 846 can include one or more layers of electrically conductive crystalline carbon material and does not include amorphous carbon material. In some embodiments, conductive carbon layer 846 can include one or more graphene layers with an electrical conductivity that is about 40% to about 70% greater than that of metals, such as Cu, Co, and Ru, and does not include amorphous carbon material. In some embodiments, each of the graphene layers can include a two-dimensional carbon layer of sp$^2$ hybridized carbon atoms. In some embodiments, conductive carbon layer 846 having one or more graphene layers can be formed in a plasma chemical vapor deposition (CVD) process with a hydrocarbon precursor at a low temperature ranging from about 200° C. to about 450° C. and at a power of about 2000 W to about 3000 W.

In some embodiments, the plasma fluorination process can be performed in a CVD chamber using CF$_x$-based (e.g., carbon tetrafluoride (CF$_4$)) or NF$_x$-based (e.g., nitrogen trifluoride (NF$_3$)) gases as the source for fluorine ions and/or radicals 960 at a low temperature ranging from about 200° C. to about 450° C. and at a power of about 500 W to about 1000 W. The fluorine ions/radicals react with conductive carbon layer 846 to form fluorinated carbon layers of first carbon-based ILD layer 142. In some embodiments, fluorinated carbon layers can include fluorinated graphene layers.

Figure 9:
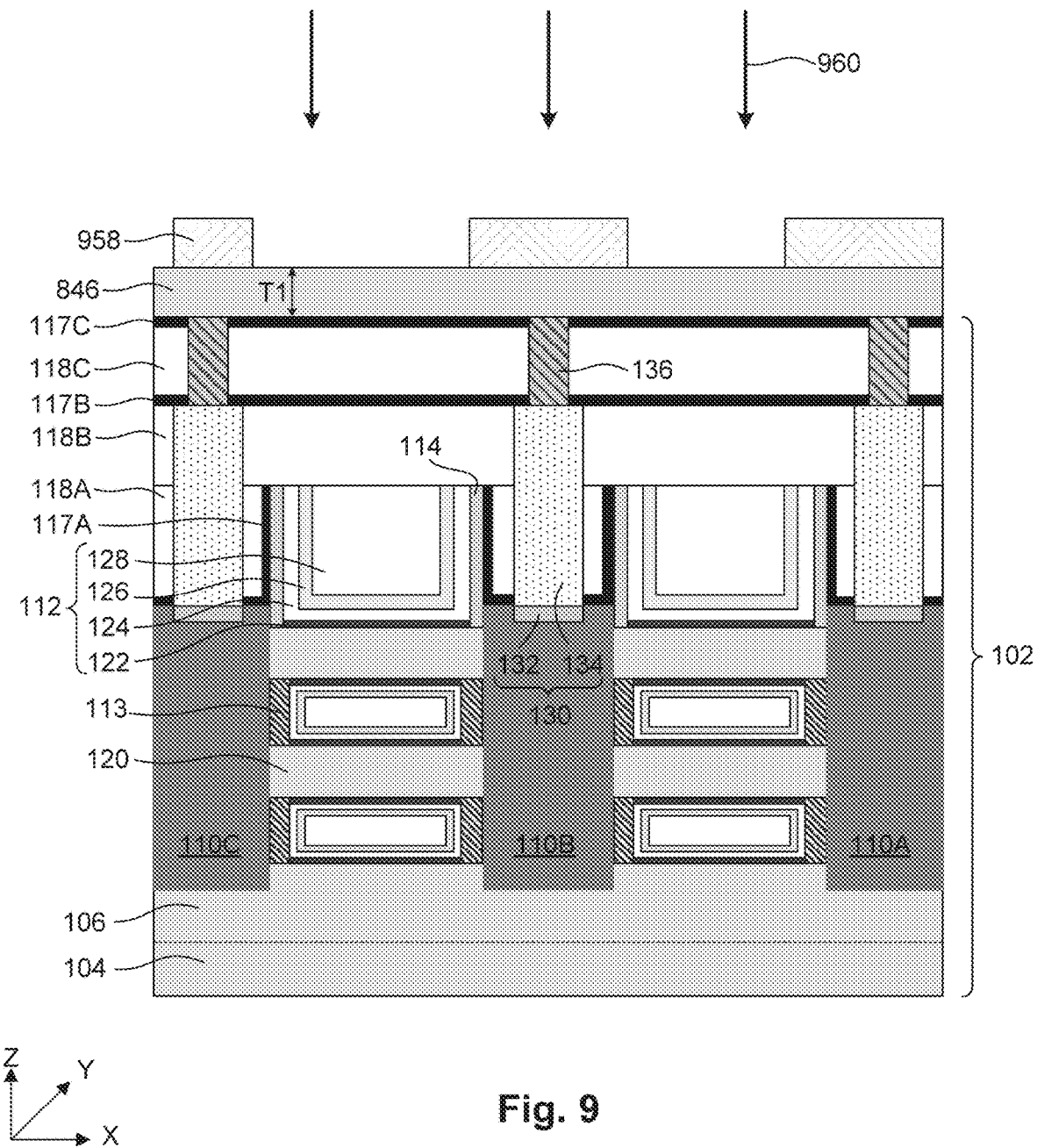
Figure 10:
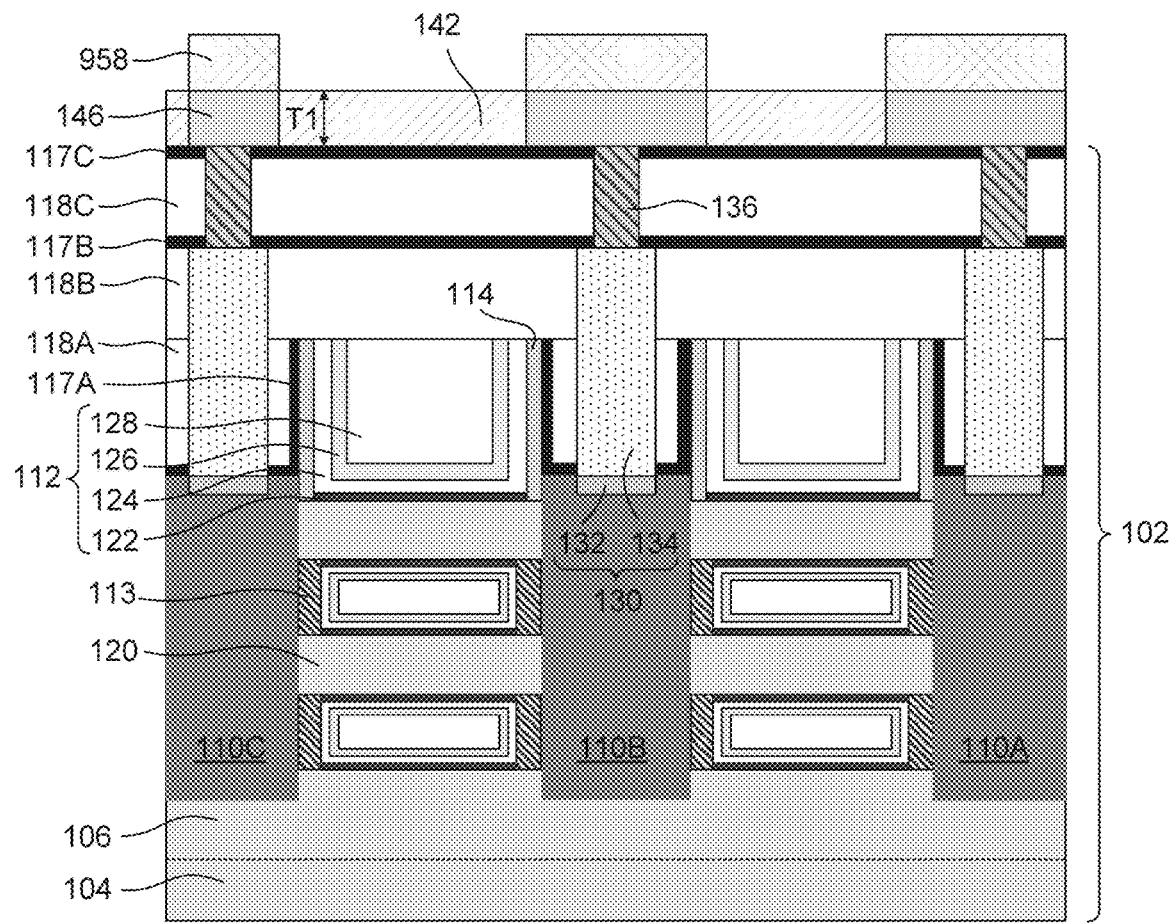
Figure 10:
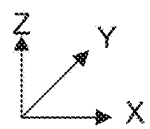

In some embodiments, instead of performing the plasma fluorination process, a plasma process with oxygen ions and/or radicals 960 (also referred to as a "plasma oxidation process") can be performed on the structure of FIG. 9 to convert unmasked portions of conductive carbon layer 846 having graphene layers into graphene oxide layers of first carbon-based ILD layer 142 with an oxygen concentration of about $1 \times 10^{18}$ atoms/cm$^3$ to about $1 \times 10^{21}$ atoms/cm$^3$.

Figure 11:
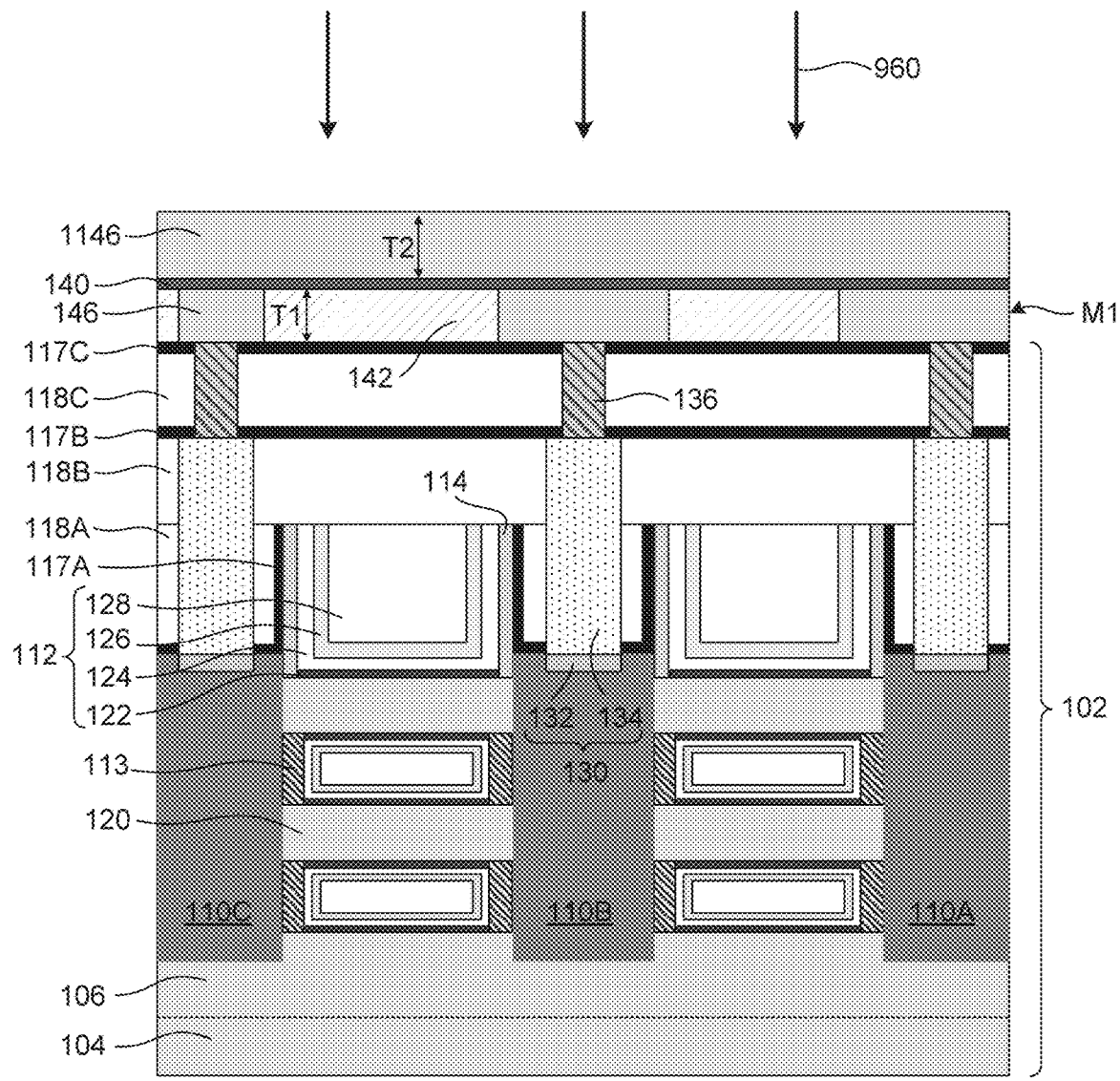

Referring to FIG. 2B, in operation 232, a first ESL is deposited on the conductive carbon lines and the first carbon-based ILD layer. For example as shown in FIG. 11, first ESL 140 of interconnect layer M1 is deposited on conductive carbon lines 146 and carbon-based ILD layer 142.

Figure 12:
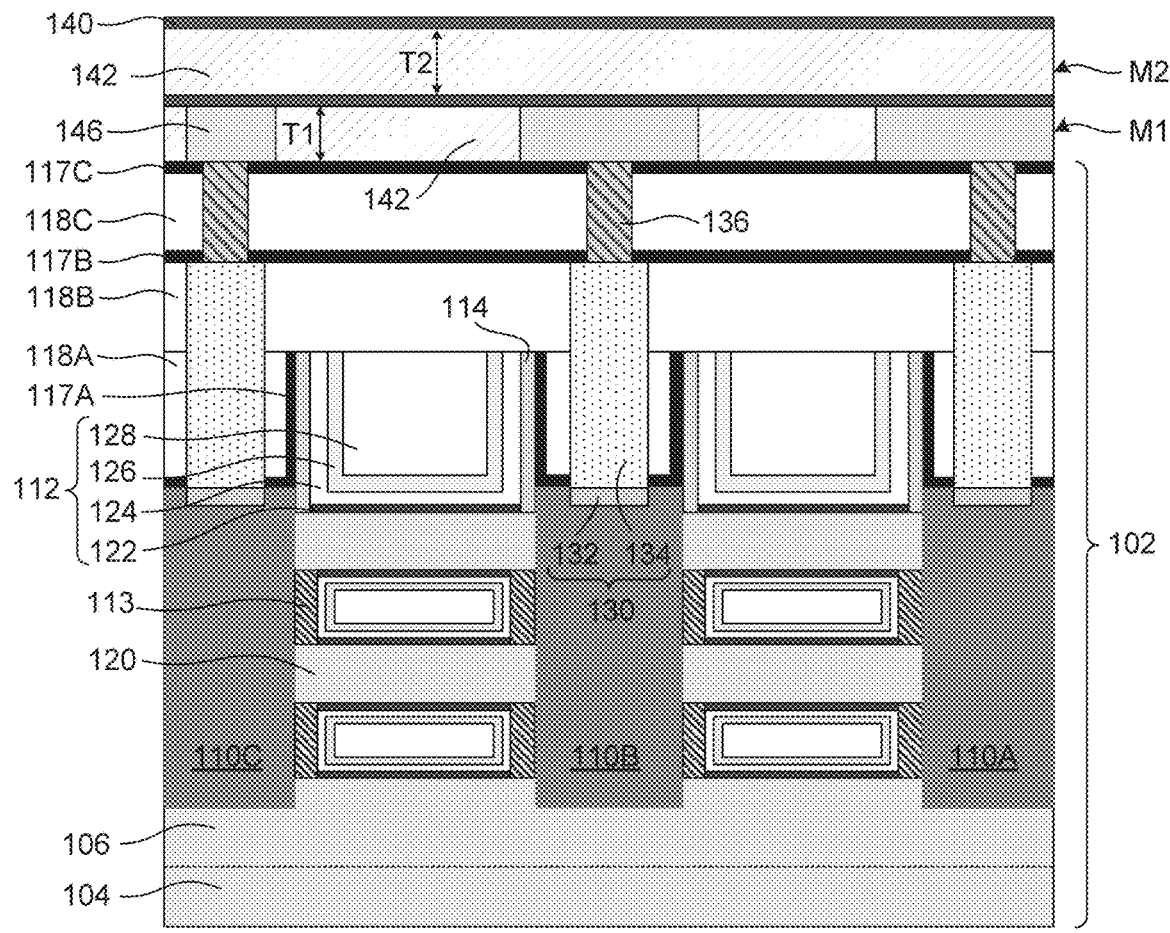

Referring to FIG. 2B, in operation 234, a second carbon-based ILD layer is formed on the first ESL. For example as described with reference to FIGS. 11-12, second carbon-based ILD layer 142 of interconnect layer M2 is formed on first ESL 140 of interconnect layer M1. The formation of second carbon-based ILD layer 142 can include sequential operations of (i) forming a conductive carbon layer 1146 on first ESL 140 of interconnect layer M1, as shown in FIG. 11, (ii) performing the plasma fluorination process on the structure of FIG. 11 to convert conductive carbon layer 1146 into fluorinated carbon layer of second carbon-based ILD layer 142 with a fluorine concentration of about $1 \times 10^{18}$ atoms/cm$^3$ to about $1 \times 10^{21}$ atoms/cm$^3$, as shown in FIG. 12. The discussion of conductive carbon layer 846 applies to conductive carbon layer 1146, unless mentioned otherwise.

Referring to FIG. 2B, in operation 236, a second ESL is deposited on the second carbon-based ILD layer. For example as shown in FIG. 12, second ESL 140 of interconnect layer M2 is deposited on second carbon-based ILD layer 142 of interconnect layer M2.

Figure 13:
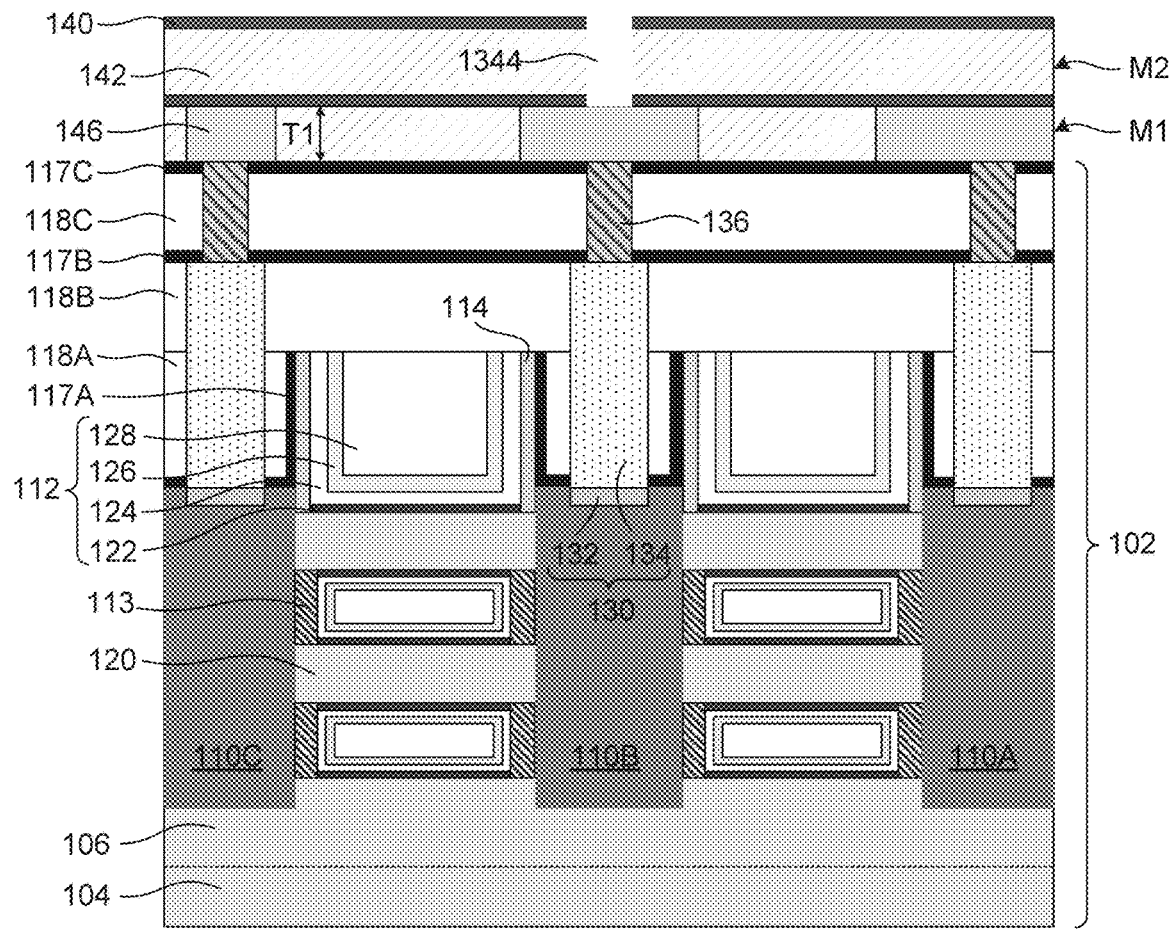
Figure 13:
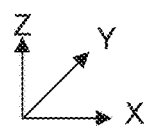
Figure 14:
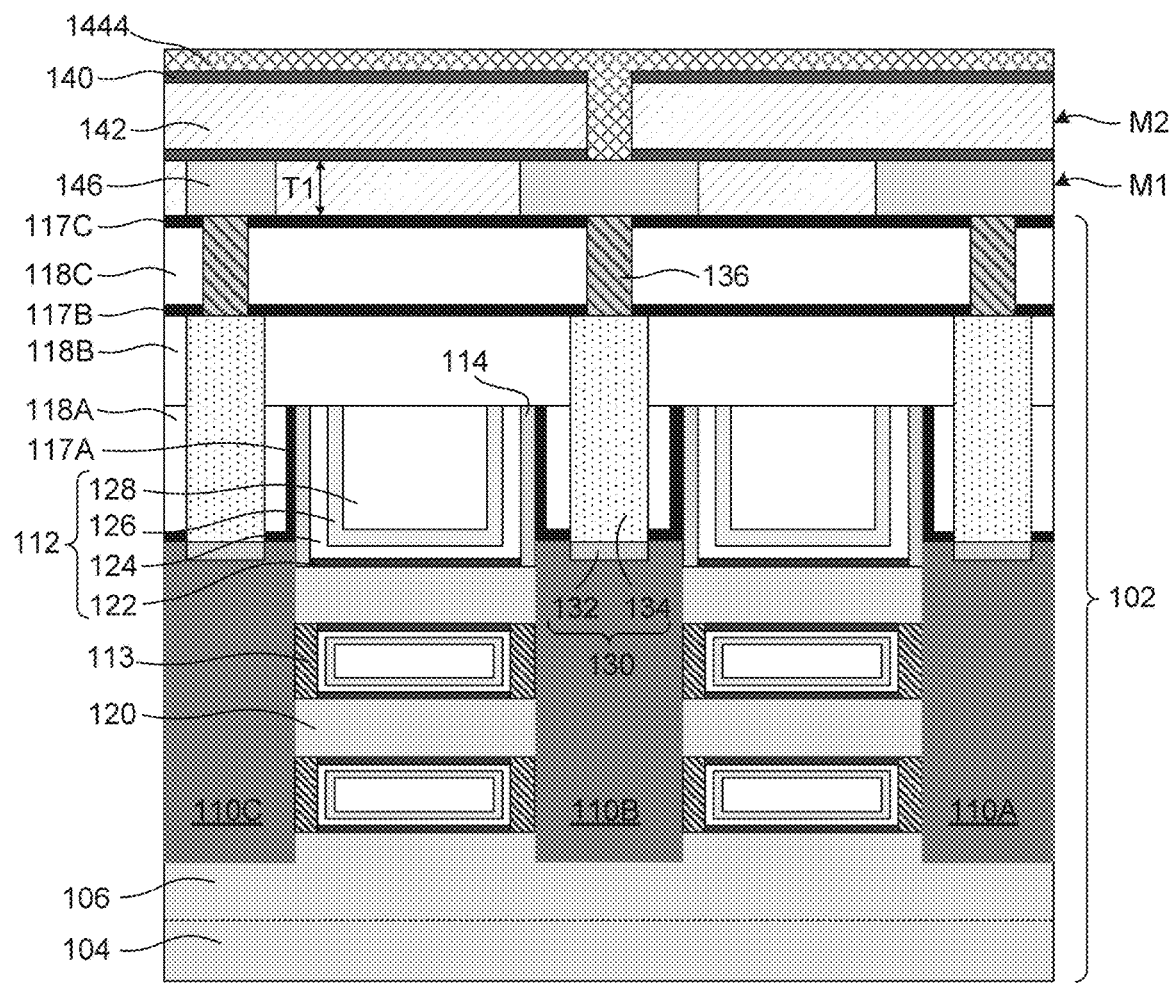
Figure 15:
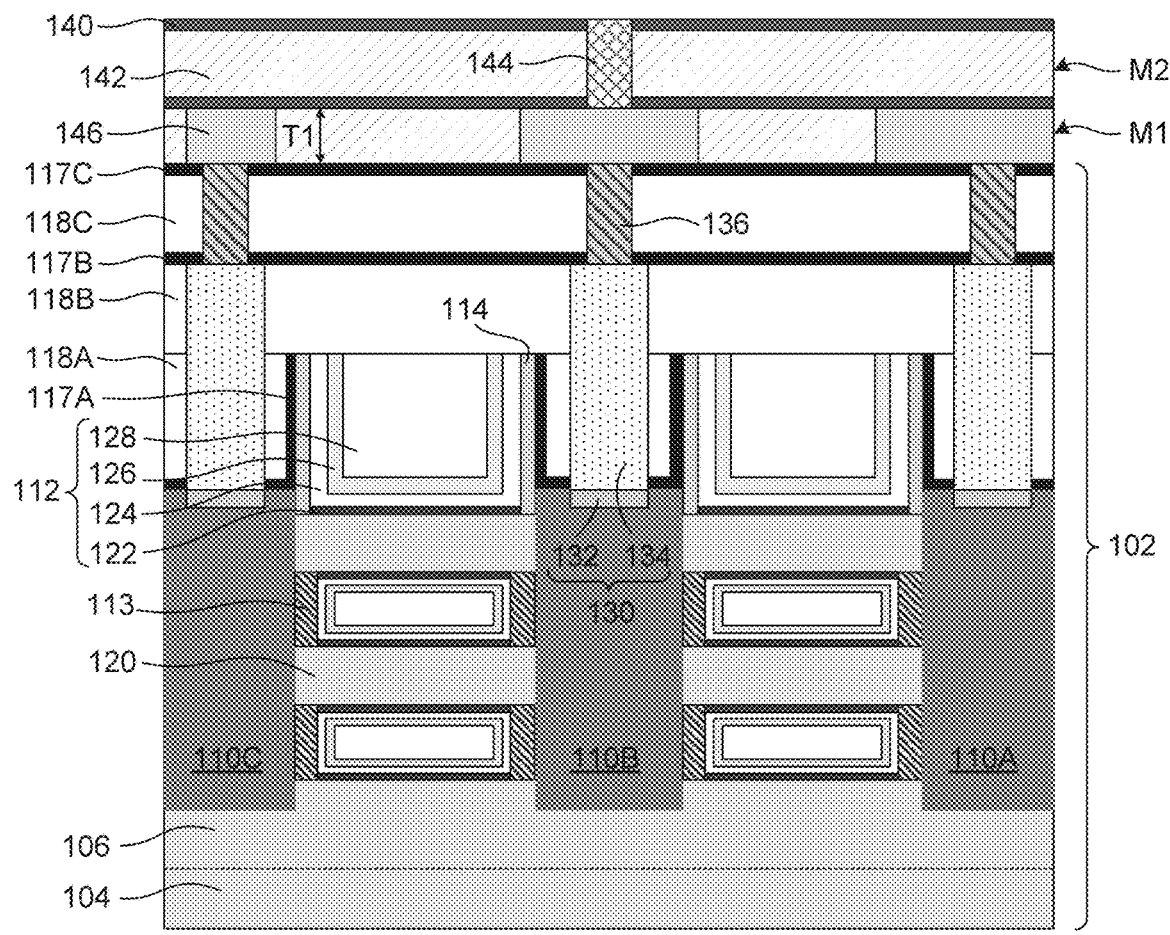
Figure 15:
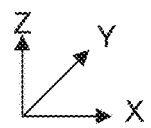

Referring to FIG. 2B, in operation 238, a conductive via is formed within the first and second ESLs and second carbon-based ILD layer. For example as described with reference to FIGS. 13-15, conducive via 144 is formed within ESLs 140 of interconnect layers M1-M2 and second carbon-based ILD layer 142 of interconnect layer M2. The formation of conducive via 144 can include sequential operations of (i) forming a via opening 1344, as shown in FIG. 13, (ii) depositing a conductive material layer 1444 on the structure of FIG. 13 to fill via opening 1344, as shown in FIG. 14, and (iii) performing a CMP on the structure of FIG. 14 to form the structure of FIG. 15 with conductive via 144.

The other conductive carbon lines 146 and conductive vias 144 overlying interconnect layer M2 can be formed in operations similar to those used for forming conductive carbon lines 146 of interconnect layer M1 and conductive via 144 of interconnect layer M2 to form interconnect structure 101 of FIG. 16.

In some embodiments, operation 225 can include operations 240-252, as shown in FIG. 2C, to form interconnect structure 101 as shown in FIG. 23.

Figure 17:
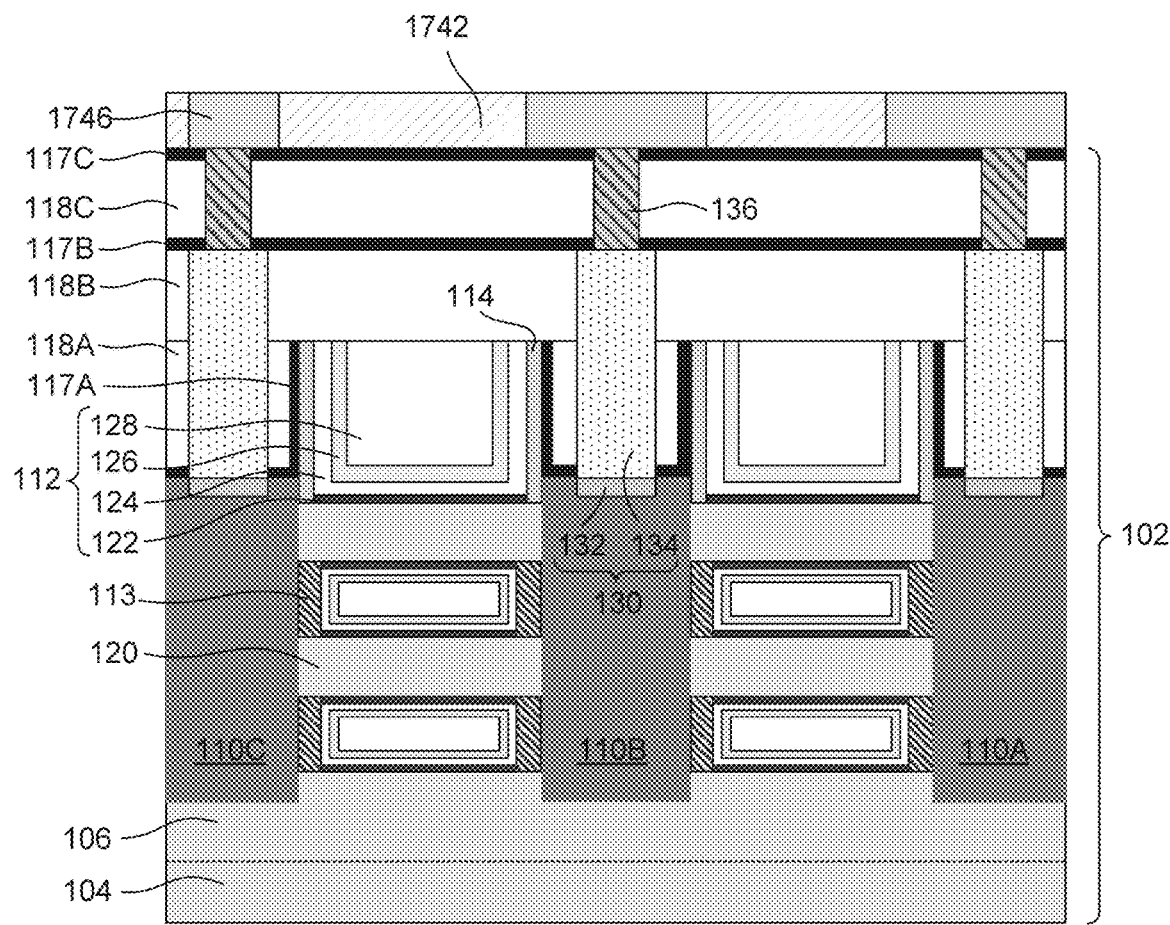
FIGS. 17-23 illustrate cross-sectional views of an integrated circuit (IC) with a semiconductor device and another interconnect structure at various stages of its fabrication process, in accordance with some embodiments.
Figure 17:
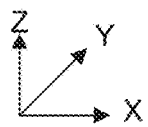
Figure 18:
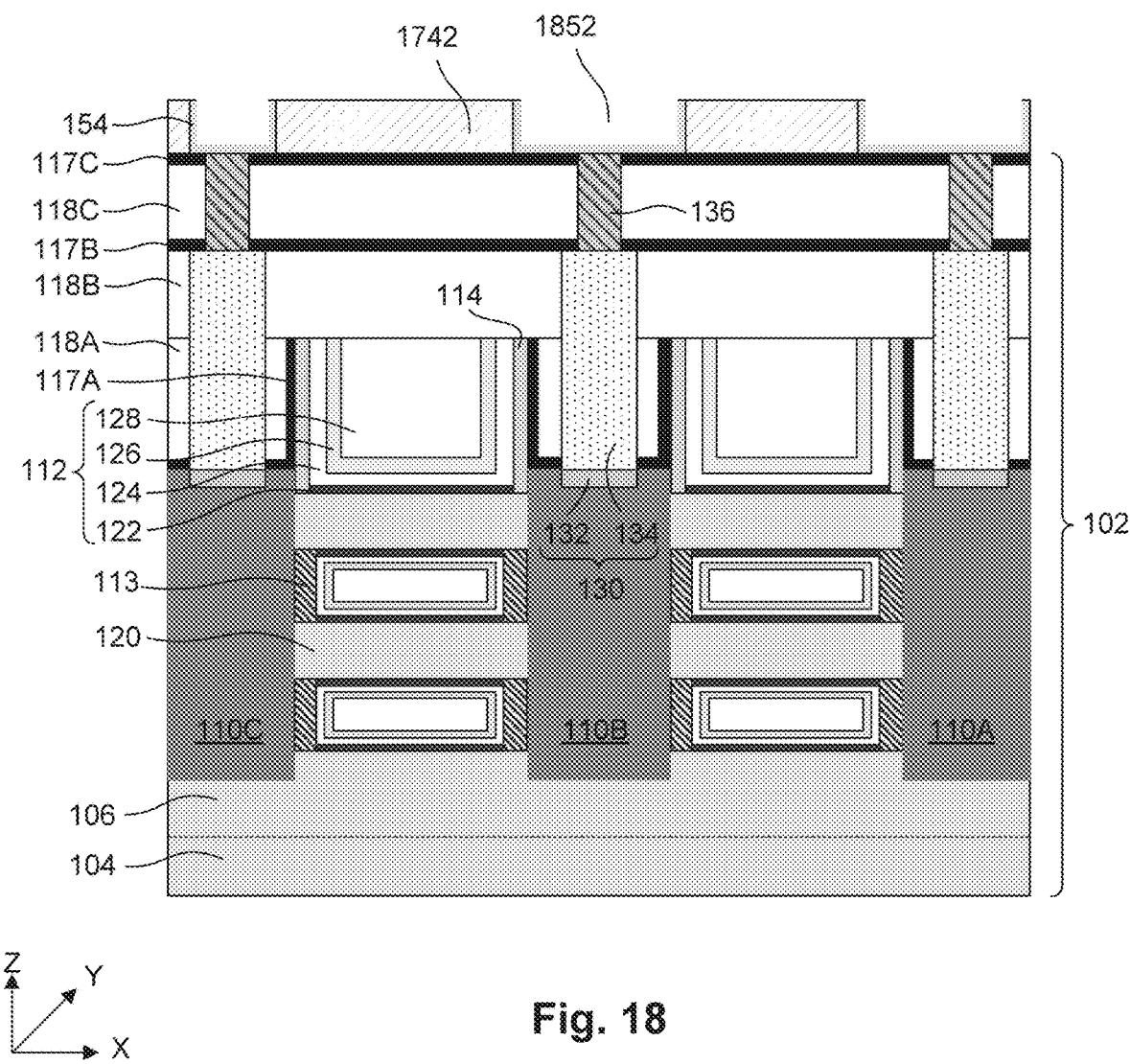

Referring to FIG. 2C, in operation 240, conductive carbon liners are formed within a first carbon-based ILD layer. For example, as described with reference to FIGS. 17-18, conductive carbon liners 154 are formed within first carbon-based ILD layer 1742. The formation of conductive carbon liners 154 can include sequential operations of (i) forming conductive carbon lines 1746 within first carbon-based ILD layer 1742, as shown in FIG. 17, and (ii) forming openings 1852 within conductive carbon lines 1746, as shown in FIG. 18. Carbon liners 154 are formed along sidewalls and base of openings 1852, as shown in FIG. 18. The formation of conductive carbon lines 1746 within first carbon-based ILD layer 1742 is similar to the formation of conductive carbon lines 146 within first carbon-based ILD layer 142, as described with reference to operation 230 of FIG. 2B. The discussion of conductive carbon lines 146 and first carbon-based ILD layer 142 applies to conductive carbon lines 1746 and first carbon-based ILD layer 1742, unless mentioned otherwise.

Figure 19:
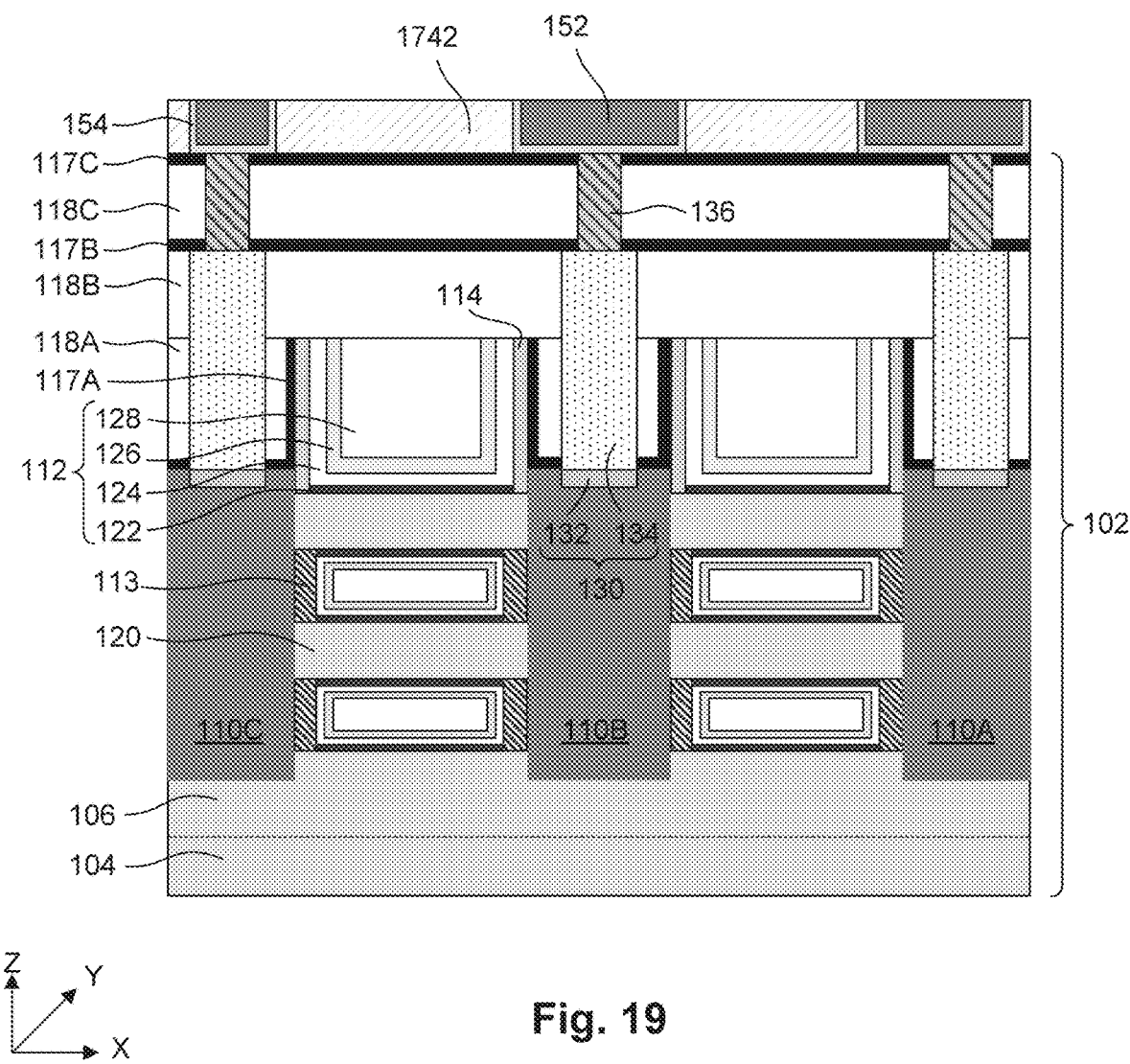

Referring to FIG. 2C, in operation 242, metal lines are formed on the conductive carbon liners. For example, as shown in FIG. 19, metal lines 152 are formed on conductive carbon liners 152. The formation of metal lines 152 can include sequential operations of (i) depositing a conductive material layer (e.g., a metal layer; not shown) on the structure of FIG. 19 to fill openings 1852, and (ii) performing a CMP on the conductive material layer to form the structure of FIG. 19 with metal lines 152.

Figure 20:
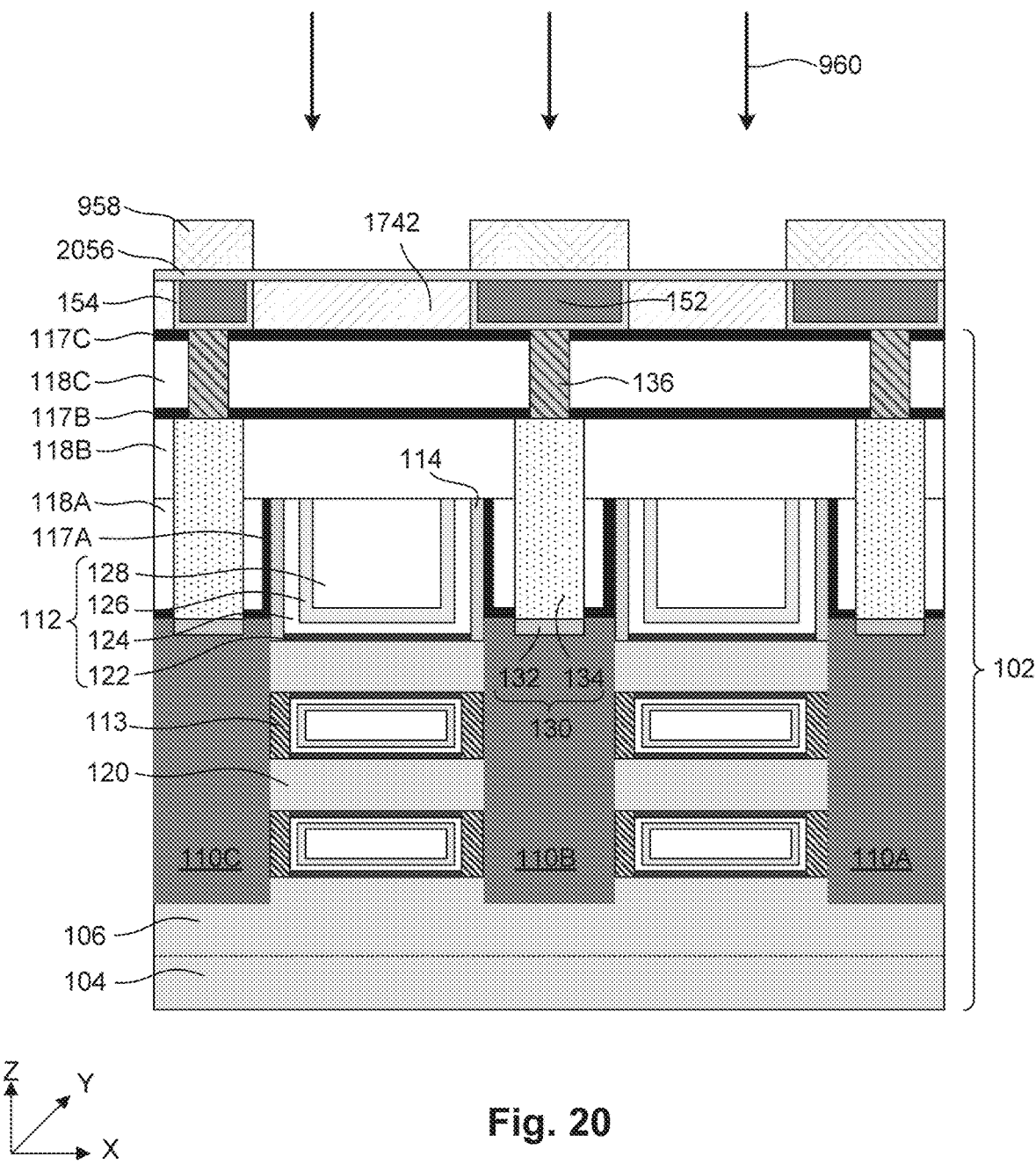
Figure 21:
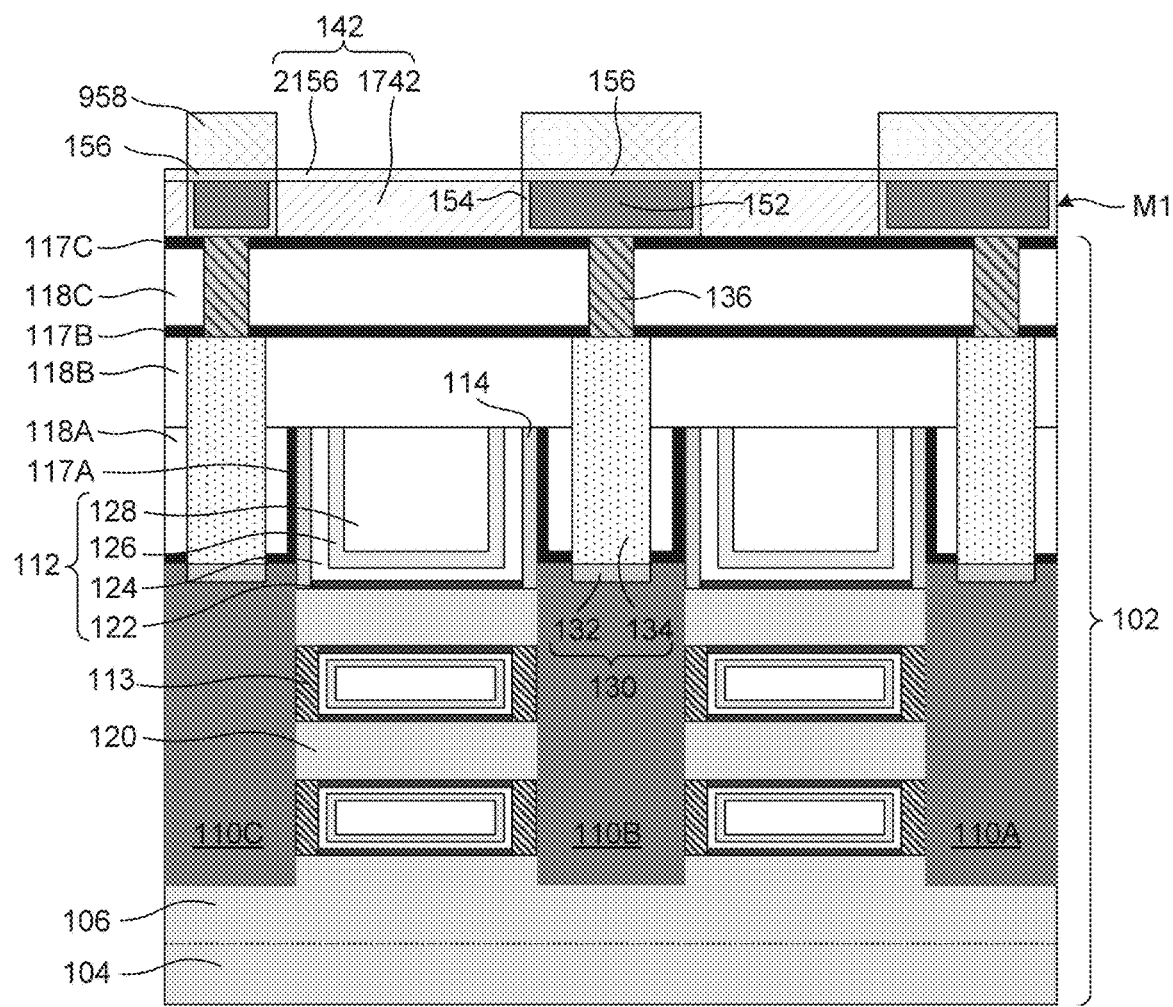

Referring to FIG. 2C, in operation 244, carbon capping layers are formed on the metal lines. For example, as described with reference to FIGS. 20-21, carbon capping layers 156 are formed on metal lines 154. The formation of carbon capping layers 156 can include sequential operations of (i) forming a conductive carbon layer 2056 on the structure of FIG. 19, as shown in FIG. 20, (ii) forming a patterned non-carbon-based masking layer 958 on conductive carbon layer 2056, as shown in FIG. 20, (iii) performing the plasma fluorination process on the structure of FIG. 20 to convert unmasked portions of conductive carbon layer 2056 into fluorinated carbon layers 2156 with a fluorine concentration of about $1\times10^{18}$ atoms/cm$^3$ to about $1\times10^{21}$ atoms/cm$^3$, as shown in FIG. 21, and (iv) removing patterned masking layer 958 from the structure of FIG. 21. The formation of conductive carbon layer 2056 is similar to the formation of conductive carbon layer 846, as described with reference to operation 230 of FIG. 2B. The discussion of conductive carbon layer 846 applies to conductive carbon layer 2056, unless mentioned otherwise.

Referring to FIG. 2C, in operation 246, a first ESL is deposited on the carbon capping layers and the first carbon-based ILD layer. For example as shown in FIG. 22, first ESL 140 of interconnect layer M1 is deposited on carbon capping layers 156 and carbon-based ILD layer 142 of interconnect layer M1.

Figure 22:
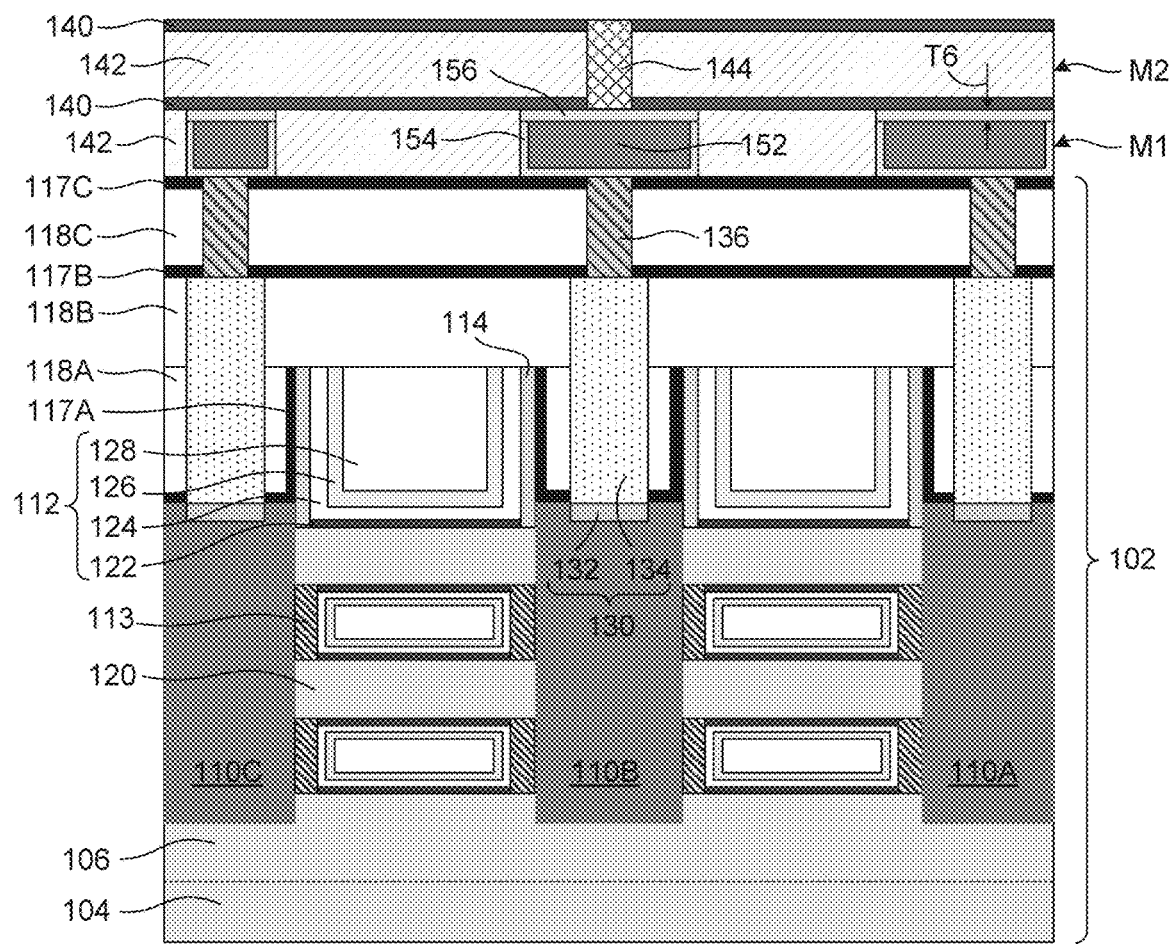

Referring to FIG. 2C, operations 248-252 are similar to operations 234-338, respectively, of FIG. 2B and are performed to form the structure of FIG. 22.

The other metal lines 152, carbon liners 154, carbon capping layers 156, and conductive vias 144 overlying interconnect layer M2 can be formed in operations similar to those used for forming metal lines 152, carbon liners 154, and carbon capping layers 156 of interconnect layer M1 and conductive via 144 of interconnect layer M2 to form interconnect structure 101 of FIG. 23.

The present disclosure provides example ICs (e.g., IC 100) with semiconductor devices (e.g., FET 102) and interconnect structures (e.g., interconnect structure 101) having carbon layers and provides methods (e.g., method 200) of fabricating the same. In some embodiments, the interconnect structure can include conductive vias (e.g., conductive vias 144) and interconnect lines (e.g., interconnect lines 146) having one or more conductive carbon layers for routing electrical signals between the semiconductor devices of the IC and/or between power lines and the semiconductor devices of the IC. In some embodiments, the one or more conductive carbon layers can include one or more conductive graphene layers. With the use of conductive carbon-based interconnect lines instead of metal-based interconnect lines, the interconnect structure can be aggressively scaled down without increasing the resistivity and/or RC delay of the interconnect lines. The resistivity and RC delay of the conductive carbon-based (e.g., conductive graphene-based) interconnect lines can be significantly lower (e.g., about 2 to about 10 times lower) than that of metal-based interconnect lines with similar dimensions. In addition, unlike some metal-based interconnect lines, the conductive carbon-based interconnect lines do not need barrier layers (also referred to as "liners") surrounding the interconnect lines to prevent electro-migration of metal atoms into the semiconductor devices. As a result, the cost and complexity of fabricating the interconnect structure with the conductive carbon lines are significantly reduced compared to that of fabricating interconnect structures with metal lines.

In some embodiments, the conductive carbon lines can be formed within carbon-based ILD layers (e.g., ILD layers 142), which can include one or more fluorinated graphene layers or graphene oxide layers. The ILD layers with fluorinated graphene layers or graphene oxide layers have a density (e.g., about 2 gm/cc to about 5 gm/cc) higher than the density of ILD layers with silicon oxide and have a dielectric constant (e.g., less than about 2) lower than the dielectric constant of ILD layers with silicon oxide. As a result, with the use of carbon-based ILD layers, the interconnect structure can be aggressively scaled down without decreasing the breakdown voltage and/or increasing the RC delay of the interconnect structure. The breakdown voltage of the carbon-based ILD layers can be significantly higher than that of silicon oxide-based ILD layers with similar dimensions.

In some embodiments, a method includes forming a fin structure on a substrate, forming a source/drain region on the fin structure, forming a contact structure on the S/D region, forming an oxide layer on the contact structure, forming a conductive carbon line within a first insulating carbon layer on the oxide layer, forming a second insulating carbon layer on the first insulating carbon layer, and forming a via within the second insulating carbon layer.

In some embodiments, a method includes forming a gate-all-around field effect transistor (GAA FET) on a substrate, forming a carbon layer with conductive and insulating portions on the GAA FET, forming an opening within the conductive portion of the carbon layer, forming a metal line within the opening, and forming a carbon capping layer on the metal line.

In some embodiments, an integrated circuit includes a semiconductor device disposed on a substrate, a dielectric layer disposed on the semiconductor device, a first insulating carbon layer disposed on the dielectric layer, a conductive carbon line disposed within the insulating carbon layer, a second insulating carbon layer disposed on the first insulating carbon layer, and a via disposed within the second insulating carbon layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin structure on a substrate;
   forming a source/drain (S/D) region on the fin structure;
   forming a contact structure on the S/D region;
   forming an oxide layer on the contact structure;
   forming a metal via in the oxide layer;
   depositing a carbon layer on and in physical contact with top surfaces of the oxide layer and the metal via;
   masking a first portion of the carbon layer in physical contact with the metal via to form a conductive carbon line;
   converting a second portion of the carbon layer in physical contact with the oxide layer and non-overlapping with the metal via into a first insulating carbon layer;
   forming a second insulating carbon layer on the first insulating carbon layer; and
   forming a via in the second insulating carbon layer and in physical contact with a top surface of the conductive carbon line.

2. The method of claim 1, wherein depositing the carbon layer comprises depositing a layer of crystalline carbon material.

3. The method of claim 1, wherein depositing the carbon layer comprises depositing a graphene layer.

4. The method of claim 1, wherein converting the second portion of the carbon layer comprises converting the second portion of the carbon layer into a fluorinated carbon layer.

5. The method of claim 1, wherein depositing the carbon layer comprises depositing a graphene layer on and in physical contact with top surfaces of the oxide layer and the metal via; and
   wherein converting the second portion of the carbon layer comprises converting a portion of the graphene layer in physical contact with the oxide layer and non-overlapping with the metal via into a graphene oxide layer.

6. The method of claim 1, wherein converting the second portion of the carbon layer comprises performing a plasma process with fluorine or oxygen ions or radicals on the second portion of the carbon layer.

7. The method of claim 1, wherein depositing the carbon layer comprises depositing the carbon layer with a carbon concentration substantially equal to a carbon concentration of the first insulating carbon layer.

8. The method of claim 1, wherein forming the second insulating carbon layer comprises:
   depositing a graphene layer on the first insulating carbon layer; and
   converting the graphene layer into a fluorinated graphene layer or a graphene oxide layer.

9. The method of claim 1, wherein forming the second insulating carbon layer comprises:
   depositing a graphene layer on the first insulating carbon layer; and
   performing a plasma process with fluorine ions or radicals on the graphene layer.

10. The method of claim 1, wherein forming the second insulating carbon layer comprises forming a graphene layer with a fluorine concentration of about $1 \times 10^{18}$ atoms/cm$^3$ to about $1 \times 10^{21}$ atoms/cm$^3$.

11. A method, comprising:
    forming a gate-all-around field effect transistor (GAA FET) on a substrate;
    forming, on the GAA FET, a carbon layer comprising a conductive layer portion and an insulating layer portion directly adjacent to the conductive layer portion;
    removing a first portion of the conductive layer portion to form an opening in the conductive layer portion, while a second portion of the conductive layer portion remains to form a conductive carbon liner along a base and sidewalls of the opening;
    depositing a metal layer on and in physical contact with the conductive carbon liner; and
    forming a carbon capping layer on the metal layer.

12. The method of claim 11, wherein forming the carbon layer comprises:
    depositing a conductive carbon layer on the GAA FET; and
    converting a portion of the conductive carbon layer into the insulating layer portion.

13. The method of claim 11, wherein forming the carbon layer comprises:
    depositing a conductive carbon layer on the GAA FET; and
    performing a plasma process with fluorine ions or radicals on a portion of the conductive carbon layer.

14. The method of claim 11, wherein forming the carbon layer comprises forming the insulating layer portion with a fluorine concentration of about $1 \times 10^{18}$ atoms/cm$^3$ to about $1 \times 10^{21}$ atoms/cm$^3$.

15. The method of claim 11, wherein forming the carbon layer comprises forming the conductive and insulating layer portions with carbon concentrations substantially equal to each other.

16. The method of claim 11, wherein forming the carbon capping layer comprises:
    depositing a conductive carbon layer on the metal layer, the conductive carbon liner, and the insulating layer portion of the carbon layer;
    forming a masking layer on a first portion of the conductive carbon layer on the metal layer; and
    performing a plasma fluorination process on a second portion of the conductive carbon layer on the insulating layer portion of the carbon layer.

17. A method, comprising:
    forming a semiconductor device on a substrate;
    depositing a dielectric layer on the semiconductor device;

forming, on the dielectric layer, a carbon layer comprising a conductive layer portion and an insulating layer portion directly adjacent to the conductive layer portion;

depositing a first insulating carbon layer on the conductive layer portion and the insulating layer portion;

etching the first insulating carbon layer to form an opening on the conductive layer portion and expose a top surface of the conductive layer portion in the opening;

forming a conductive carbon layer in the opening and in physical contact with the exposed top surface of the conductive layer portion; and depositing a second insulating carbon layer on the first insulating carbon layer and the conductive carbon layer.

18. The method of claim 17, wherein forming the conductive carbon layer comprises depositing a graphene layer in the opening.

19. The method of claim 17, wherein depositing the first insulating carbon layer comprises depositing a graphene layer with a fluorine concentration of about $1 \times 10^{18}$ atoms/cm$^3$ to about $1 \times 10^{21}$ atoms/cm$^3$.

20. The method of claim 17, wherein forming the conductive carbon layer comprises depositing a graphene layer with a carbon concentration substantially equal to a carbon concentration in the first insulating carbon layer.

* * * * *